US012571969B2

(12) United States Patent
Sun et al.

(10) Patent No.: US 12,571,969 B2
(45) Date of Patent: Mar. 10, 2026

(54) OPTICAL MODULE HAVING ELECTRICALLY-CONNECTED SUBSTRATE

(71) Applicant: HISENSE BROADBAND MULTIMEDIA TECHNOLOGIES CO., LTD., Qingdao (CN)

(72) Inventors: Feilong Sun, Qingdao (CN); Qinhao Fu, Qingdao (CN); Jianwei Mu, Qingdao (CN); Kan Zhang, Qingdao (CN)

(73) Assignee: HISENSE BROADBAND MULTIMEDIA TECHNOLOGIES CO., LTD., Qingdao (CN)

( * ) Notice: Subject to any disclaimer, the term of this patent is extended or adjusted under 35 U.S.C. 154(b) by 503 days.

(21) Appl. No.: 18/146,068

(22) Filed: Dec. 23, 2022

(65) Prior Publication Data

US 2023/0194802 A1     Jun. 22, 2023

Related U.S. Application Data

(63) Continuation of application No. PCT/CN2021/134455, filed on Nov. 30, 2021.

(30) Foreign Application Priority Data

Dec. 17, 2020    (CN) .......................... 202011496690.6
Sep. 16, 2021    (CN) .......................... 202111088244.6
(Continued)

(51) Int. Cl.
*G02B 6/42*          (2006.01)
*G02B 6/12*          (2006.01)
(Continued)

(52) U.S. Cl.
CPC ....... *G02B 6/4206* (2013.01); *G02B 6/12007* (2013.01); *G02B 6/4214* (2013.01);
(Continued)

(58) Field of Classification Search
CPC .......................... G02B 6/12007; G02B 6/4214; G02B 6/4268; G02B 6/4278; G02B 6/428;
(Continued)

(56) References Cited

U.S. PATENT DOCUMENTS 6,288,647 B1 *    9/2001    Yamano ............... G08B 17/107
                                                                      340/630
7,948,760 B2 *    5/2011    Kawauchi .............. H05K 1/189
                                                                      361/749
(Continued)

FOREIGN PATENT DOCUMENTS

CN          101154637 A      4/2008
CN          101923193 A      12/2010
(Continued)

OTHER PUBLICATIONS

First Chinese Office Action dated Mar. 31, 2022 in corresponding Chinese Application No. 202111088602.3, translated, 23 pages.
(Continued)

*Primary Examiner* — Andrew Jordan
(74) *Attorney, Agent, or Firm* — MH2 TECHNOLOGY LAW GROUP LLP

(57)          ABSTRACT

An optical module includes a circuit board and a light receiving assembly. The light receiving assembly is electrically connected to the circuit board and configured to receive optical signals from outside of the optical module. The light receiving assembly includes a light receiving cavity, an optical amplification assembly and a light receiving chip. The optical amplification assembly is disposed in the light receiving cavity and configured to amplify the optical signals. The optical amplification assembly includes a fourth substrate and a semiconductor optical amplifier (SOA). The fourth substrate is electrically connected to the circuit board, and the SOA is disposed on the fourth substrate and is electrically connected to the fourth substrate, (Continued)

The light receiving chip is disposed in the light receiving cavity and configured to receive the amplified optical signals.

20 Claims, 13 Drawing Sheets

(30) Foreign Application Priority Data

| | | | |
|---|---|---|---|
| Sep. 16, 2021 | (CN) | .......................... | 202111088602.3 |
| Sep. 16, 2021 | (CN) | .......................... | 202122251048.8 |
| Sep. 16, 2021 | (CN) | .......................... | 202122253630.8 |

(51) Int. Cl.
  *H01S 5/50* (2006.01)
  *H04B 10/60* (2013.01)

(52) U.S. Cl.
  CPC ......... *G02B 6/4268* (2013.01); *G02B 6/4278* (2013.01); *G02B 6/428* (2013.01); *H01S 5/50* (2013.01); *H04B 10/60* (2013.01)

(58) Field of Classification Search
  CPC ......................... G02B 6/29367; G02B 6/4284; G02B 6/4215; G02B 6/4271; G02B 6/4206; H01S 5/50; H04B 10/60; H04B 10/673
  See application file for complete search history.

(56) References Cited

U.S. PATENT DOCUMENTS

| | | | | |
|---|---|---|---|---|
| 8,373,992 | B2 * | 2/2013 | Kawauchi | G02B 6/4292 361/749 |
| 9,025,913 | B2 * | 5/2015 | Lee | G02B 6/43 385/88 |
| 9,116,314 | B2 * | 8/2015 | Yasuda | G02B 6/4202 |
| 9,325,420 | B2 * | 4/2016 | Lai | G02B 6/43 |
| 9,772,458 | B1 * | 9/2017 | Kim | G02B 6/4257 |
| 10,349,492 | B2 * | 7/2019 | Sugiyama | H01S 5/0687 |
| 11,784,720 | B2 * | 10/2023 | Mii | G02B 6/428 398/212 |
| 11,811,433 | B2 * | 11/2023 | Nagarajan | H01S 5/142 |
| 11,994,724 | B2 * | 5/2024 | Wright | G02B 6/4287 |
| 12,124,095 | B2 * | 10/2024 | Winterbottom | G01K 7/028 |
| 12,132,519 | B2 * | 10/2024 | Li | G02B 6/42 |
| 12,164,162 | B2 * | 12/2024 | Winterbottom | G02F 1/0113 |
| 12,242,122 | B2 * | 3/2025 | Winterbottom | G02F 1/0123 |
| 12,298,608 | B1 * | 5/2025 | Winterbottom | G02B 6/428 |
| 2003/0072076 | A1 | 4/2003 | Yoon et al. | |
| 2005/0168957 | A1 * | 8/2005 | Kawauchi | G02B 6/4292 361/783 |
| 2011/0182546 | A1 * | 7/2011 | Yasuda | G02B 6/423 385/31 |
| 2011/0267784 | A1 * | 11/2011 | Kawauchi | H05K 1/189 361/749 |
| 2014/0037243 | A1 * | 2/2014 | Lee | G02B 6/43 29/852 |
| 2015/0333831 | A1 * | 11/2015 | Lai | G02B 6/428 250/208.2 |
| 2016/0013869 | A1 | 1/2016 | Teranishi | |
| 2017/0068059 | A1 | 3/2017 | Wang et al. | |
| 2017/0370569 | A1 | 12/2017 | He et al. | |
| 2018/0249555 | A1 * | 8/2018 | Sugiyama | G01J 1/4257 |
| 2018/0278013 | A1 | 9/2018 | Kanskar et al. | |
| 2020/0251610 | A1 | 8/2020 | Dülk | |
| 2021/0154845 | A1 | 5/2021 | Kokobun | |
| 2022/0171142 | A1 * | 6/2022 | Wright | G02B 6/4219 |

| | | | | |
|---|---|---|---|---|
| 2022/0271843 | A1 * | 8/2022 | Mii | G02B 6/428 |
| 2022/0407604 | A1 * | 12/2022 | Nagarajan | H04B 10/40 |
| 2023/0127729 | A1 * | 4/2023 | Li | G02B 6/42 398/43 |
| 2023/0194802 | A1 * | 6/2023 | Sun | H04B 10/673 385/14 |
| 2023/0333332 | A1 * | 10/2023 | Tu | H04B 10/60 |
| 2023/0350137 | A1 * | 11/2023 | Yu | G02B 6/4206 |
| 2023/0418010 | A1 * | 12/2023 | Winterbottom | G01K 7/028 |
| 2024/0272392 | A1 * | 8/2024 | Winterbottom | G01K 7/028 |
| 2024/0272393 | A1 * | 8/2024 | Winterbottom | G01K 7/14 |
| 2024/0280769 | A1 * | 8/2024 | Huang | G02B 6/4286 |
| 2024/0353634 | A1 * | 10/2024 | Beaupré-Laflamme | G02B 6/4204 |
| 2025/0007608 | A1 * | 1/2025 | Li | H04J 14/0307 |
| 2025/0216517 | A1 * | 7/2025 | Liao | G01S 7/4816 |
| 2025/0224576 | A1 * | 7/2025 | Shao | G02B 6/4292 |
| 2025/0231430 | A1 * | 7/2025 | Winterbottom | G01K 7/028 |
| 2025/0231431 | A1 * | 7/2025 | Winterbottom | G02F 1/0157 |

FOREIGN PATENT DOCUMENTS

| | | |
|---|---|---|
| CN | 102520494 A | 6/2012 |
| CN | 204009154 U | 12/2014 |
| CN | 104836619 A | 8/2015 |
| CN | 104965267 A | 10/2015 |
| CN | 105957846 A | 9/2016 |
| CN | 107367791 A | 11/2017 |
| CN | 108259087 A | 7/2018 |
| CN | 108347284 A | 7/2018 |
| CN | 108809425 A | 11/2018 |
| CN | 108873197 A | 11/2018 |
| CN | 209283247 U | 8/2019 |
| CN | 110376691 A | 10/2019 |
| CN | 210327587 U | 4/2020 |
| CN | 111106526 A | 5/2020 |
| CN | 111458816 A | 7/2020 |
| CN | 111555811 A | 8/2020 |
| CN | 111628828 A | 9/2020 |
| CN | 211528767 U | 9/2020 |
| CN | 111999823 A | 11/2020 |
| CN | 212083733 U | 12/2020 |
| CN | 112505855 A | 3/2021 |
| CN | 112828897 A | 5/2021 |
| CN | 112838897 A | 5/2021 |
| CN | 213302601 U | 5/2021 |
| CN | 213780449 U | 7/2021 |
| IN | 212083734 U | 12/2020 |
| JP | 2016028415 A | 2/2016 |
| WO | 2020089483 A1 | 5/2020 |

OTHER PUBLICATIONS

Second Chinese Office Action dated Sep. 5, 2022 in corresponding Chinese Application No. 202111088602.3, translated, 24 pages.
Supplementary Chinese Search Report dated Nov. 23, 2022 in corresponding Chinese Application No. 202111088602.3, 2 pages.
First Chinese Office Action dated Apr. 2, 2022 in corresponding Chinese Application No. 202111088244.6, translated, 24 pages.
Second Chinese Office Action dated Sep. 5, 2022 in corresponding Chinese Application No. 202111088244.6, translated, 41 pages.
Supplementary Chinese Search Report dated Dec. 19, 2022 in corresponding Chinese Application No. 202111088244.6, 2 pages.
First Chinese Office Action dated Nov. 1, 2022 in corresponding Chinese Application No. 202011496690.6, translated, 24 pages.
Decision of Rejection dated Feb. 17, 2023 in corresponding Chinese Application No. 202011496690.6, translated, 20 pages.
International Search Report and Written Opinion dated Mar. 1, 2022 in corresponding International Application No. PCT/CN2021/134455, translated, 18 pages.

* cited by examiner

OPTICAL MODULE HAVING ELECTRICALLY-CONNECTED SUBSTRATE

CROSS-REFERENCE TO RELATED APPLICATIONS

This application is a Continuation Application of International Patent Application No. PCT/CN2021/134455 filed on Nov. 30, 2021, which claims priority to Chinese Patent Application No. 202011496690.6, filed on Dec. 17, 2020, Chinese Patent Application No. 202111088244.6, filed on Sep. 16, 2021, Chinese Patent Application No. 202122253630.8, filed on Sep. 16, 2021, Chinese Patent Application No. 202111088602.3, filed on Sep. 16, 2021, and Chinese Patent Application No. 202122251048.8, filed on Sep. 16, 2021, which are incorporated herein by reference in their entireties.

TECHNICAL FIELD

The present disclosure relates to the field of optical communication technologies, and in particular, to an optical module.

BACKGROUND

With the development of new services and application modes such as cloud computing, mobile internet, and video conferencing, the development and progress of optical communication technologies become increasingly important. In the optical communication technologies, an optical module is a tool for achieving interconversion between an optical signal and an electrical signal and is one of the key devices in an optical communication device.

SUMMARY

Some embodiments of the present disclosure provide an optical module. The optical module includes a circuit board and a light receiving assembly. The light receiving assembly is electrically connected to the circuit board and is configured to receive optical signals from outside of the optical module. The light receiving assembly includes a light receiving cavity, an optical amplification assembly, and a light receiving chip. The optical amplification assembly is disposed in the light receiving cavity and is configured to amplify the optical signals, and the optical amplification assembly includes a fourth substrate and a semiconductor optical amplifier (SOA). The fourth substrate is electrically connected to the circuit board, and the SOA is disposed on the fourth substrate and is electrically connected to the fourth substrate. The light receiving chip is disposed in the light receiving cavity and is configured to receive the amplified optical signals.

BRIEF DESCRIPTION OF THE DRAWINGS

In order to describe technical solutions in the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual size of products, actual processes of methods and actual timings of signals to which the embodiments of the present disclosure relate.

DETAILED DESCRIPTION

Figure 1:
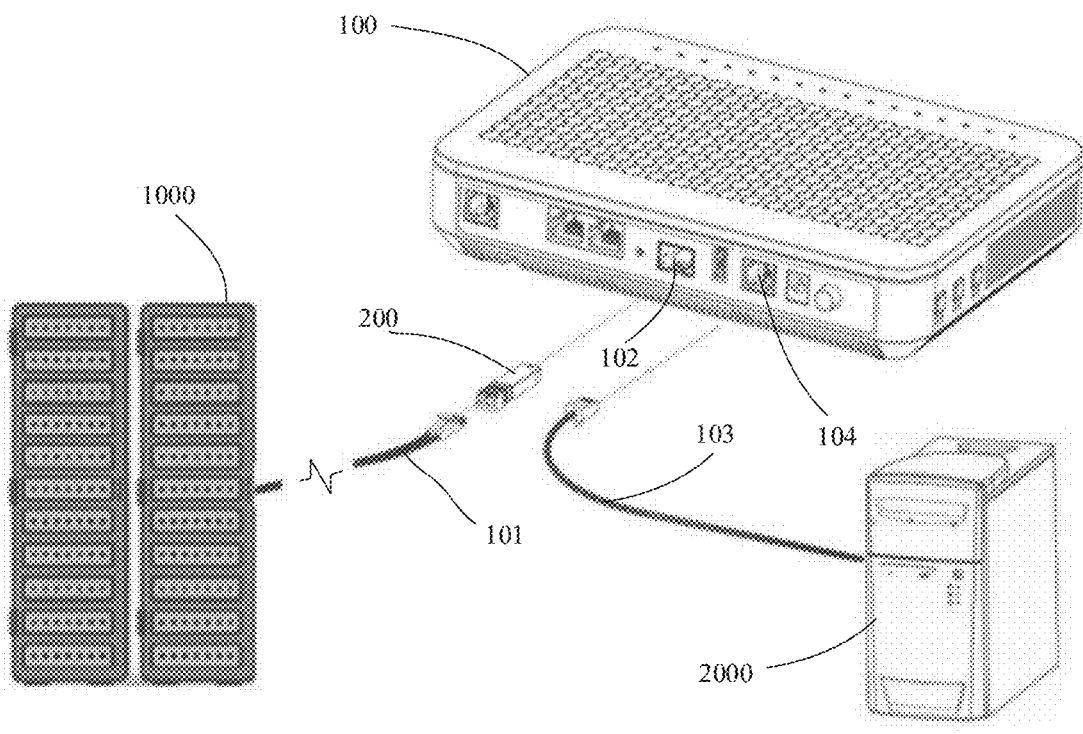
FIG. 1 is a connection diagram of an optical communication system, in accordance with some embodiments.

Technical solutions in some embodiments of the present disclosure will be described clearly and completely below with reference to the accompanying drawings. However, the described embodiments are merely some but not all of embodiments of the present disclosure. All other embodiments obtained on a basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive sense, i.e., "including, but not limited to." In the description of the specification, the term such as "one embodiment," "some embodiments," "exemplary embodiments," "example," "specific example," or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, specific features, structures, materials, or characteristics described herein may be included in any one or more embodiments or examples in any suitable manner.

Hereinafter, the terms such as "first" and "second" are used for descriptive purposes only and are not to be construed as indicating or implying a relative importance or implicitly indicating the number of indicated technical features. Therefore, the features defined with "first" and "second" may explicitly or implicitly include one or more of these features. In the description of the embodiments of the present disclosure, the term "a/the plurality of" means two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. The term "coupled" or "communicatively coupled," however, may also mean that two or more components are not in direct contact with each other, but still cooperate or interact with each other. The embodiments disclosed herein are not necessarily limited to the content herein.

The phrase "at least one of A, B, and C" has the same meaning as the phrase "at least one of A, B, or C," both including following combinations of A, B, and C: only A, only B, only C, a combination of A and B, a combination of A and C, a combination of B and C, and a combination of A, B, and C.

The phrase "A and/or B" includes following three combinations: only A, only B, and a combination of A and B.

The usage of the phrase "applicable to" or "configured to" herein means an open and inclusive language, which does not exclude devices that are applicable to or configured to perform additional tasks or steps.

The term "about", "substantially" and "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

As used herein, "parallel," "perpendicular," and "equal" include the stated conditions and the conditions similar to the stated conditions, and the range of the similar conditions is within the acceptable deviation range, where the acceptable deviation range is determined by a person of ordinary skill in the art in consideration of the measurement in question and the error associated with the measurement of a specific quantity (i.e., the limitation of the measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, that a difference between two equals is less than or equal to 5% of either of the two equals.

In optical communication technology, light is used to carry information to be transmitted, and an optical signal carrying the information is transmitted to an information processing device such as a computer through an information transmission device such as an optical fiber or an optical waveguide, so as to achieve transmission of the information. Since an optical signal has a characteristic of passive transmission when being transmitted through the optical fiber or the optical waveguide, low-cost and low-loss information transmission may be achieved. In addition, a signal transmitted by the information transmission device such as the optical fiber or the optical waveguide is an optical signal, while a signal that can be recognized and processed by the information processing device such as the computer is an electrical signal. Therefore, in order to establish information connection between the information transmission device such as the optical fiber or the optical waveguide and the information processing device such as the computer, it is necessary to realize interconversion between the electrical signal and the optical signal.

An optical module implements the interconversion between the optical signal and the electrical signal in the field of optical fiber communication technology. The optical module includes an optical port and an electrical port. The optical module achieves optical communication with the information transmission device such as the optical fiber or the optical waveguide through the optical port, and achieves electrical connection with an optical network terminal (e.g., an optical modem) through the electrical port. The electrical connection is mainly used for achieving power supply, transmission of an Inter-integrated circuit (I2C) signal, transmission of data signal and grounding. The optical network terminal transmits an electrical signal to the information processing device such as the computer through a network cable or wireless fidelity (Wi-Fi).

FIG. 1 is a connection diagram of an optical communication system, in accordance with some embodiments. As shown in FIG. 1, the optical communication system includes a remote server 1000, a local information processing device 2000, an optical network terminal 100, an optical module 200, an optical fiber 101, and a network cable 103.

An end of the optical fiber 101 is connected to the remote server 1000, and the other end thereof is connected to the optical network terminal 100 through the optical module 200. The optical fiber itself can support long-distance signal transmission, e.g., several-kilometer (6-kilometer to 8-kilometer) signal transmission. On this basis, ultra-long-distance transmission may be achieved theoretically if a repeater is used. Therefore, in a typical optical communication system, a distance between the remote server 1000 and the optical network terminal 100 may typically reach several kilometers, tens of kilometers or hundreds of kilometers.

An end of the network cable 103 is connected to the local information processing device 2000, and the other end thereof is connected to the optical network terminal 100. The local information processing device 2000 may include any or more of the following devices: a router, a switch, a computer, a mobile phone, a tablet computer, or a television.

A physical distance between the remote server 1000 and the optical network terminal 100 is greater than a physical distance between the local information processing device 2000 and the optical network terminal 100. Connection between the local information processing device 2000 and the remote server 1000 is accomplished through the optical fiber 101 and the network cable 103, and connection between the optical fiber 101 and the network cable 103 is accomplished through the optical module 200 and the optical network terminal 100.

The optical network terminal 100 includes a housing in a substantially cuboid shape, and an optical module interface 102 and a network cable interface 104 that are disposed on the housing. The optical module interface 102 is configured to connect to the optical module 200, so that bidirectional electrical signal connection is established between the optical network terminal 100 and the optical module 200. The network cable interface 104 is configured to connect to the network cable 103, so that bidirectional electrical signal connection is established between the optical network terminal 100 and the network cable 103. Connection between the optical module 200 and the network cable 103 is established through the optical network terminal 100. For example, the optical network terminal 100 transmits electrical signals from the optical module 200 to the network cable 103, and transmits electrical signals from the network cable 103 to the optical module 200. Therefore, the optical network terminal 100, as a master monitor of the optical module 200, can monitor the operation of the optical module 200. In addition to the optical network terminal 100, the master monitor of the optical module 200 may further include an optical line terminal (OLT).

The optical module 200 includes an optical port and an electrical port. The optical port is configured to be connected to the optical fiber 101, so that bidirectional optical signal connection is established between the optical module 200 and the optical fiber 101. The electrical port is configured to connect to the optical network terminal 100, so that bidirectional electrical signal connection is established between the optical module 200 and the optical network terminal 100. The interconversion between the optical signal and the electrical signal is achieved by the optical module 200, so that connection between the optical fiber 101 and the optical network terminal 100 is established. For example, optical signals from the optical fiber 101 are converted into electrical signals by the optical module 200, and then the electrical signals are input into the optical network terminal 100. Electrical signals from the optical network terminal 100 are converted into optical signals by the optical module 200, and then the optical signals are input into the optical fiber 101. Since the optical module 200 is a tool for achieving the interconversion between the optical signal and the electrical signal, and has no function of processing data, information does not change in the above photoelectric conversion process.

A bidirectional signal transmission channel between the remote server 1000 and the local information processing device 2000 is established through the optical fiber 101, the optical module 200, the optical network terminal 100, and the network cable 103.

Figure 2:
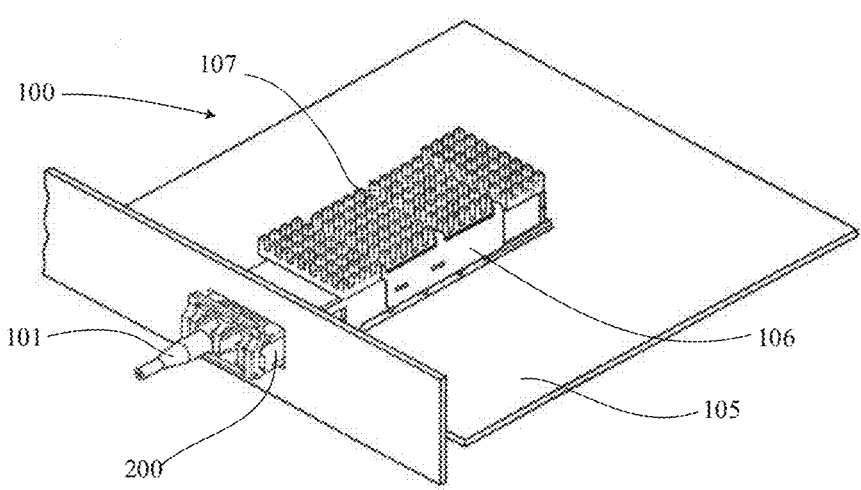
FIG. 2 is a structural diagram of an optical network terminal, in accordance with some embodiments.

FIG. 2 is a structural diagram of an optical network terminal, in accordance with some embodiments. In order to clearly show a connection relationship between the optical module 200 and the optical network terminal 100, FIG. 2 only shows portions of the optical network terminal 100 related to the optical module 200. As shown in FIG. 2, the optical network terminal 100 further includes a PCB circuit board 105 disposed in the housing, a cage 106 disposed on a surface of the PCB circuit board 105, a heat sink 107 disposed on the cage 106, and an electrical connector disposed inside the cage 106. The electrical connector is configured to connect to the electrical port of the optical module 200; and the heat sink 107 has protruding portions such as fins that increase a heat dissipation area.

The optical module 200 is inserted into the cage 106 of the optical network terminal 100 and is fixed by the cage 106. Heat generated by the optical module 200 is conducted to the cage 106 and is then diffused by the heat sink 107. After the optical module 200 is inserted into the cage 106, the electrical port of the optical module 200 is connected to the electrical connector inside the cage 106, so that the bidirectional electrical signal connection is established between the optical module 200 and the optical network terminal 100. In addition, the optical port of the optical module 200 is connected to the optical fiber 101, so that the bidirectional optical signal connection is established between the optical module 200 and the optical fiber 101.

Figure 3:
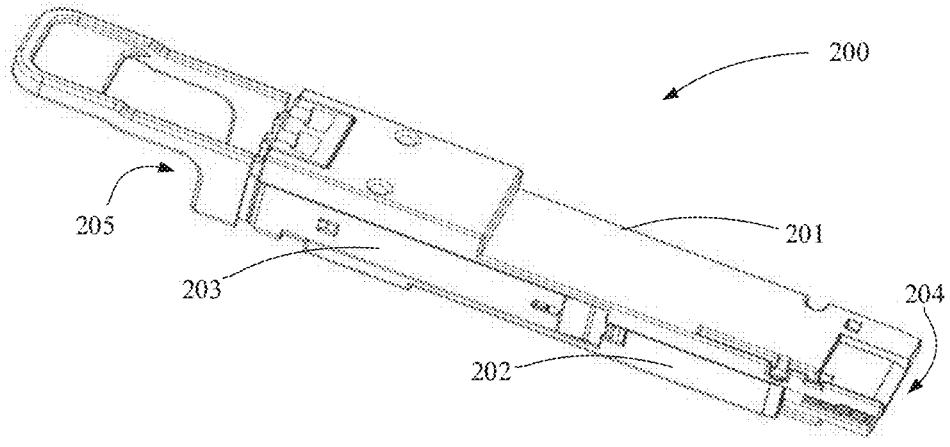
FIG. 3 is a structural diagram of an optical module, in accordance with some embodiments.
Figure 4:
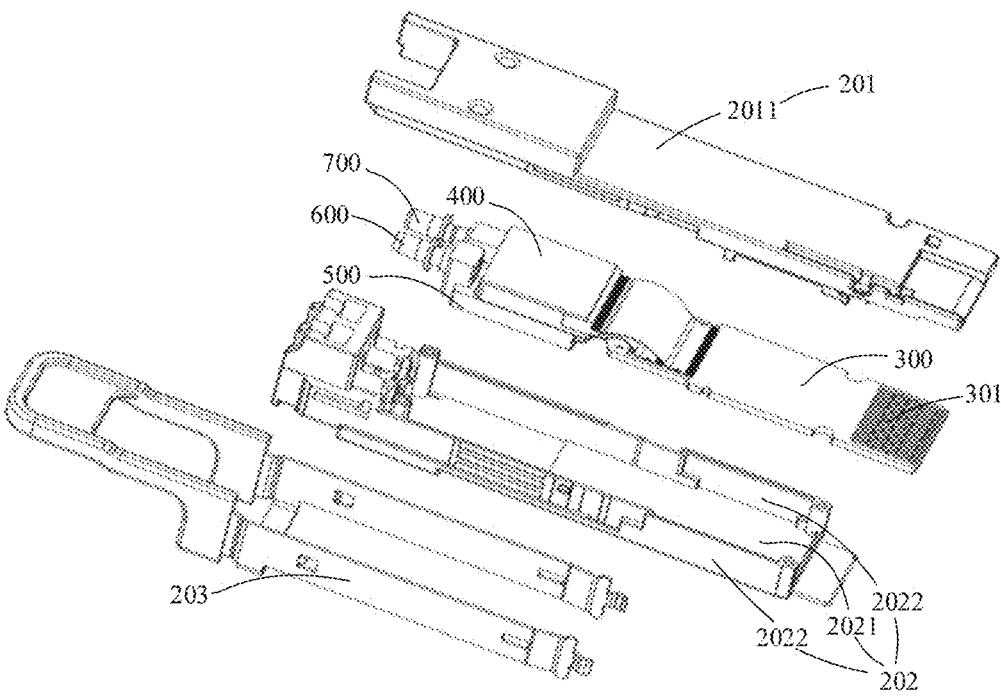
FIG. 4 is a diagram showing a disassembled structure of an optical module, in accordance with some embodiments.

FIG. 3 is a structural diagram of an optical module, in accordance with some embodiments, and FIG. 4 is a diagram showing a disassembled structure of an optical module, in accordance with some embodiments. As shown in FIGS. 3 and 4, the optical module 200 includes a shell, and a circuit board 300, a light emitting assembly 400 and a light receiving assembly 500 that are disposed inside the shell. However, the structure of the optical module 200 is not limited thereto. In some embodiments, the optical module 200 includes the light emitting assembly 400 but does not include the light receiving assembly 500, or the optical module 200 includes the light receiving assembly 500 but does not include the light emitting assembly 400.

The shell includes an upper shell 201 and a lower shell 202. The upper shell 201 covers the lower shell 202 to form the shell with two openings 204 and 205, and an outer contour of the shell is generally in a cuboid shape.

In some embodiments, the lower shell 202 includes a bottom plate 2021 and two lower side plates 2022 that are arranged perpendicular to the bottom plate 2021 and located on two sides of the bottom plate 2021 respectively; and the upper shell 201 includes a cover plate 2011, and the cover plate 2011 covers the two lower side plates 2022 of the lower shell 202 to form the shell.

In some embodiments, the lower shell 202 includes a bottom plate 2021 and two lower side plates 2022 that are arranged perpendicular to the bottom plate 2021 and located on two sides of the bottom plate 2021 respectively; the upper shell 201 includes a cover plate 2011 and two upper side plates that are arranged perpendicular to the cover plate 2011 and located on two sides of the cover plate 2011 respectively. The two upper side plates are combined with the two lower side plates 2022, so that the upper shell 201 covers the lower shell 202.

A direction in which a connecting line between the two openings 204 and 205 extends may be or may not be the same as a length direction of the optical module 200. For example, the opening 204 is located at an end (a right end in FIG. 3) of the optical module 200, and the opening 205 is located at an end (a left end in FIG. 3) of the optical module 200. Alternatively, the opening 204 is located at an end of the optical module 200, while the opening 205 is located at a side of the optical module 200. The opening 204 is the electrical port, and a connecting finger 301 of the circuit board 300 extends from the electrical port 204 and is inserted into the master monitor (e.g., the optical network terminal 100). The opening 205 is the optical port and is configured to connect to an external optical fiber 101, so that the optical fiber 101 is connected to the light emitting assembly 400 and the light receiving assembly 500 in the optical module 200.

With help of an assembly manner of combining the upper shell 201 with the lower shell 202, it is helpful to install components such as the circuit board 300, the light emitting assembly 400, and the light receiving assembly 500 into the shell, and these components may be encapsulated and protected by the upper shell 201 and the lower shell 202. In addition, during assembly of the components such as the circuit board 300, the light emitting assembly 400, and the light receiving assembly 500, it is also helpful to arrange positioning elements, heat dissipation elements, and electromagnetic shielding elements of these components, which facilitates automated implementation of production.

In some embodiments, the upper shell 201 and the lower shell 202 are made of a metallic material, which facilitates electromagnetic shielding and heat dissipation.

In some embodiments, the optical module 200 further includes an unlocking component 203 located outside the shell thereof, and the unlocking component 203 is configured to implement or release a fixed connection between the optical module 200 and the master monitor.

For example, the unlocking component 203 is on outer sides of the two lower side plates 2022 of the lower shell 202, and includes an engagement component that is matched with a cage of the master monitor (e.g., the cage 106 of the optical network terminal 100). When the optical module 200 is inserted into the cage 106, the optical module 200 is fixed in the cage 106 by the engagement component of the unlocking component 203. When the unlocking component 203 is pulled, the engagement component of the unlocking component 203 moves with the pulling, and then a connection relationship between the engagement component and the master monitor is changed to release an engagement relationship between the optical module 200 and the master monitor, and thus the optical module 200 may be drawn out of the cage 106.

The circuit board 300 includes circuit wires, electronic elements, and chips. Through the circuit wires, the electronic elements and the chips are connected together according to a circuit design, so as to achieve functions such as power supply, electrical signal transmission, and grounding. The electronic elements may include, for example, a capacitor, a resistor, a triode, and a metal-oxide-semiconductor field-effect transistor (MOSFET). The chips may include, for example, a microcontroller unit (MCU), a laser driver chip, a transimpedance amplifier (TIA), a limiting amplifier, a clock and data recovery (CDR) chip, a power management chip, or a digital signal processing (DSP) chip.

The circuit board 300 is generally a rigid circuit board, and the rigid circuit board may also achieve a bearing function due to its relatively hard material, for example, the rigid circuit board may stably bear the electronic elements and the chips. The rigid circuit board may also be inserted into an electrical connector inside the cage 106 of the master monitor.

The circuit board 300 further includes the connecting finger 301 formed on a surface of the end thereof, and the connecting finger 301 is composed of a plurality of pins independent of each other. The circuit board 300 is inserted into the cage 106, and is conductively connected to the electrical connector inside the cage 106 through the connecting finger 301. The connecting finger 301 may be disposed on only a surface (e.g., an upper surface shown in FIG. 4) of the circuit board 300, or may be disposed on both upper and lower surfaces of the circuit board 300 to adapt to an occasion with a demand for a large number of pins. The connecting finger 301 is configured to establish electrical connection with the master monitor to achieve power supply, grounding, transmission of I2C signals, transmission of data signals, etc. Of course, flexible circuit boards are also used in some optical modules. A flexible circuit board is generally used in conjunction with a rigid circuit board as a supplement for the rigid circuit board.

In some embodiments, the light emitting assembly 400 and the light receiving assembly 500 are disposed on a side of the circuit board 300 and away from the connecting finger 301, and the light emitting assembly 400 and the light receiving assembly 500 are stacked. For example, as shown in FIG. 4, the light emitting assembly 400 is disposed on a side of the light receiving assembly 500 proximate to the upper shell 201, or the light emitting assembly 400 is disposed on a side of the light receiving assembly 500 away from the upper shell 201 (i.e., a side of the light receiving assembly 500 proximate to the lower shell 202). In some embodiments, the light emitting assembly 400 and the light receiving assembly 500 may be integrated into a one-piece structure, or may be disposed in a cavity formed by the upper shell 201 and the lower shell 202 in a non-stacked manner. In some embodiments, the optical module 200 further includes a first fiber optic adapter assembly 600 and a second fiber optic adapter assembly 700. The first fiber optic adapter assembly 600 is connected to the light receiving assembly 500 and is configured to transmit an optical signal from the outside of the optical module 200 to the light receiving assembly 500. The second fiber optic adapter assembly 700 is connected to the light emitting assembly 400 and is configured to transmit an optical signal from the light emitting assembly 500 to the outside of the optical module 200.

Figure 5:
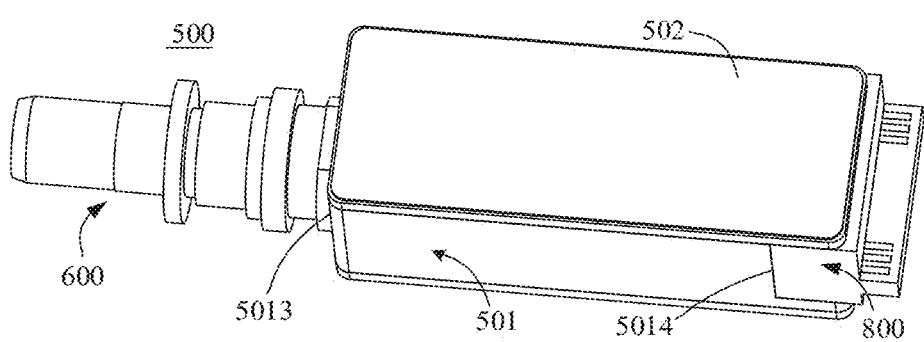
FIG. 5 is a structural diagram of a light receiving assembly, in accordance with some embodiments.
Figure 6:
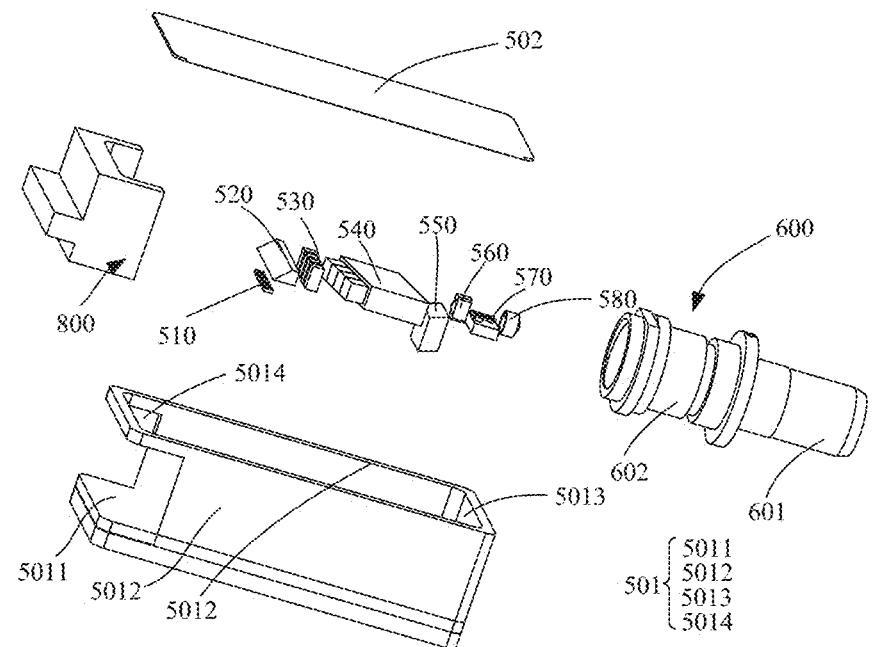
FIG. 6 is a diagram showing a disassembled structure of a light receiving assembly in an optical module, in accordance with some embodiments.
Figure 7:
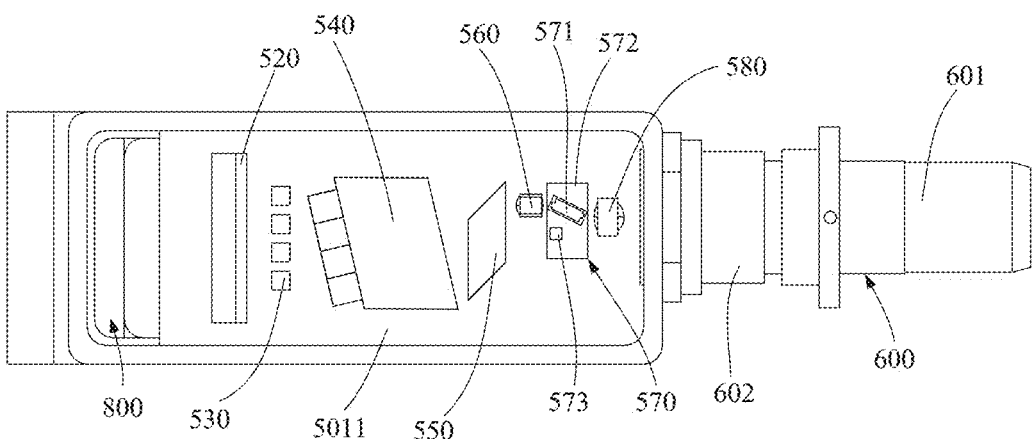
FIG. 7 is a top view of a light receiving assembly in an optical module with a light receiving upper cover removed, in accordance with some embodiments.

In some embodiments, the light emitting assembly 400 and the light receiving assembly 500 are physically separated from the circuit board 300, and are each electrically connected to the circuit board 300 through a corresponding flexible circuit board or electrical connector. FIG. 5 is a structural diagram of a light receiving assembly in an optical module, in accordance with some embodiments. FIG. 6 is a diagram showing a disassembled structure of a light receiving assembly in an optical module, in accordance with some embodiments. FIG. 7 is a top view of a light receiving assembly in an optical module with a light receiving upper cover removed, in accordance with some embodiments. As shown in FIGS. 5, 6, and 7, the light receiving assembly 500 includes a light receiving cavity, and a light receiving chip 510, a reflecting prism 520, a lens group 530, a demultiplexing (DeMUX) assembly 540, a shift prism 550, a first lens 560, an optical amplification assembly 570, and a second lens 580 that are disposed inside the light receiving cavity.

The light receiving cavity includes a light receiving lower shell 501 and a light receiving upper cover 502, and the light receiving upper cover 502 covers the light receiving lower shell 501 to form the light receiving cavity. However, the structure of the light receiving cavity is not limited thereto.

In some embodiments, the light receiving lower shell 501 and the light receiving upper cover 502 are structural members made of a metallic material. For example, the light receiving lower shell 501 and the light receiving upper cover 502 are metal pieces manufactured by using die casting and milling processes.

In some embodiments, the light receiving lower shell 501 includes a light receiving bottom plate 5011, and two light receiving side plates 5012 that are arranged perpendicular to the light receiving bottom plate 5011 and located on two sides of the light receiving bottom plate 5011 respectively; and the light receiving upper cover 502 covers the two light receiving side plates 5012 of the light receiving lower shell 501 to form the light receiving cavity.

The light receiving lower shell 501 further includes a first opening 5013 and a second opening 5014 that are arranged opposite to each other. A direction of a connecting line between the first opening 5013 and the second opening 5014 is the same as a length direction of the light receiving assembly 500. For example, the first opening 5013 is located at an end (a left end in FIG. 5) of the light receiving lower shell 501, and the second opening 5014 is located at an end (a right end in FIG. 5) of the light receiving lower shell 501. The first opening 5013 communicates with the second opening 5014.

As shown in FIGS. 5 and 6, an end of the first fiber optic adapter assembly 600 enters the light receiving cavity through the first opening 5013; and the other end of the first fiber optic adapter assembly 600 is connected to the optical fiber 101 through the optical port 205.

Figure 10A:
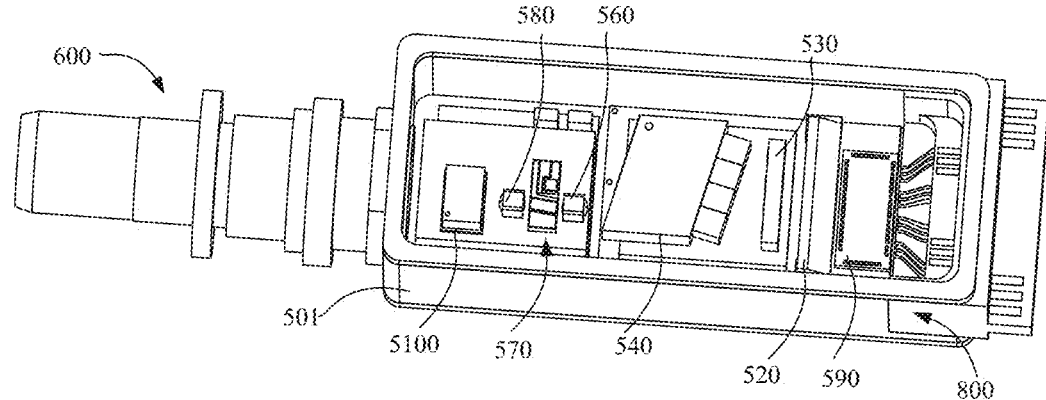
FIG. 10A is a structural diagram of a light receiving assembly in an optical module with a light receiving upper cover removed, in accordance with some embodiments.
Figure 10B:
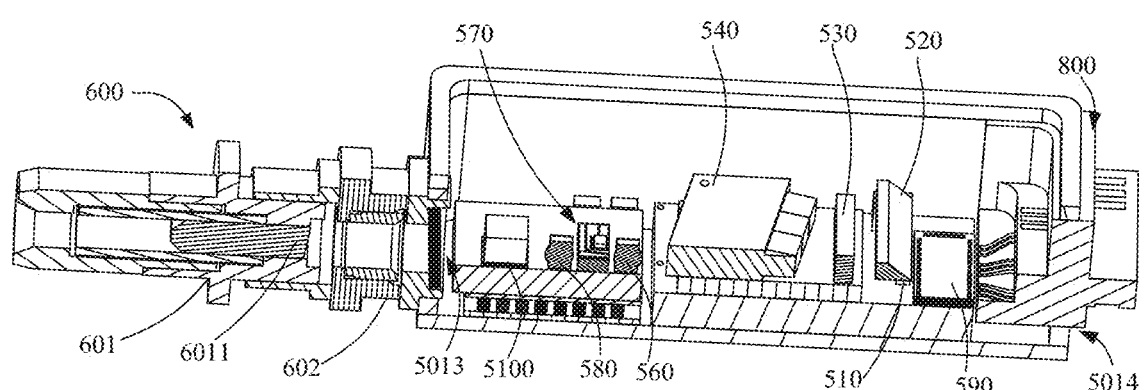
FIG. 10B is a sectional view of the light receiving assembly shown in FIG. 10A.

In some embodiments, as shown in FIGS. 6, 7 and 10B, the first fiber optic adapter assembly 600 includes a fiber optic adapter 601 and an adapter connector 602. The fiber optic adapter 601 is configured to transmit an optical signal from the outside of the optical module 200 to the adapter connector 602; and the fiber optic adapter 601 includes a fiber optic ferrule 6011 disposed inside the fiber optic adapter 601. The adapter connector 602 is configured to transmit an optical signal from the fiber optic adapter 601 into the light receiving cavity of the light receiving assembly 500. For example, an end of the fiber optic adapter 601 is connected to the optical fiber 101, and the other end thereof is connected to an end of the adapter connector 602; and the other end of the adapter connector 602 is connected to the first opening 5013 of the light receiving lower shell 501. In some embodiments, the adapter connector 602 includes an optoelectronic device such as a lens. However, the structure of the adapter connector 602 is not limited thereto, and the adapter connector 602 may not include a lens.

In some embodiments, the optical module 200 further includes an electrical connector 800. The electrical connector 800 is embedded in the second opening 5014 of the light receiving lower shell 501. An end of the electrical connector 800 enters the light receiving cavity through the second opening 5014, and is electrically connected to devices inside the light receiving cavity; and the other end of the electrical connector 800 is electrically connected to the circuit board 300. In this way, the light receiving assembly 500 is electrically connected to the circuit board 300 through the electrical connector 800, converts an optical signal from the outside of the optical module 200 into an electrical signal, and transmits the electrical signal to the circuit board 300. For example, an end of the electrical connector 800 is electrically connected to the devices inside the light receiving cavity through a wire bonding process, and the other end of the electrical connector 800 is electrically connected to the circuit board 300 through a flexible circuit board.

Based on this, in the optical module 200 in some embodiments of the present disclosure, since the first fiber optic adapter assembly 600 is disposed at the first opening 5013 of the light receiving lower shell 501 and the electrical connector 800 is embedded in the second opening 5014 of the light receiving lower shell 501, an end of the light receiving assembly 500 is connected to the first fiber optic adapter assembly 600, and the other end thereof is electrically connected to the circuit board 300 through the electrical connector 800. As a result, the optical signal from the outside of the optical module 200 is transmitted into the light receiving cavity of the light receiving assembly 500 through the first fiber optic adapter assembly 600, and then transmission of the optical signal and conversion between the optical signal and the electrical signal are performed through various devices (e.g., the second lens 580, the optical amplification assembly 570, the first lens 560, the shift prism 550, the DeMUX assembly 540, the lens group 530, the reflecting prism 520 and the light receiving chip 510) inside the light receiving cavity, and the electrical signal obtained after conversion is transmitted to the circuit board 300 through the electrical connector 800.

In some embodiments, the light receiving lower shell 501 further includes a light window. The light window is disposed at the first opening 5013, and is configured to seal the light receiving cavity. For example, the light window has a planar structure, and is disposed in the first opening 5013 in an inclined manner, that is, a plane where the light window is located is not perpendicular to a central axis of the first opening 5013. In this way, the planar light window disposed in the inclined manner is used to prevent the optical signal transmitted into the light receiving cavity from returning to the first fiber optic adapter assembly 600, so that the optical signal reflected by the devices inside the light receiving cavity is prevented from contaminating the optical signal transmitted from the outside of the optical module 200 to the first fiber optic adapter assembly 600.

Figure 8A:
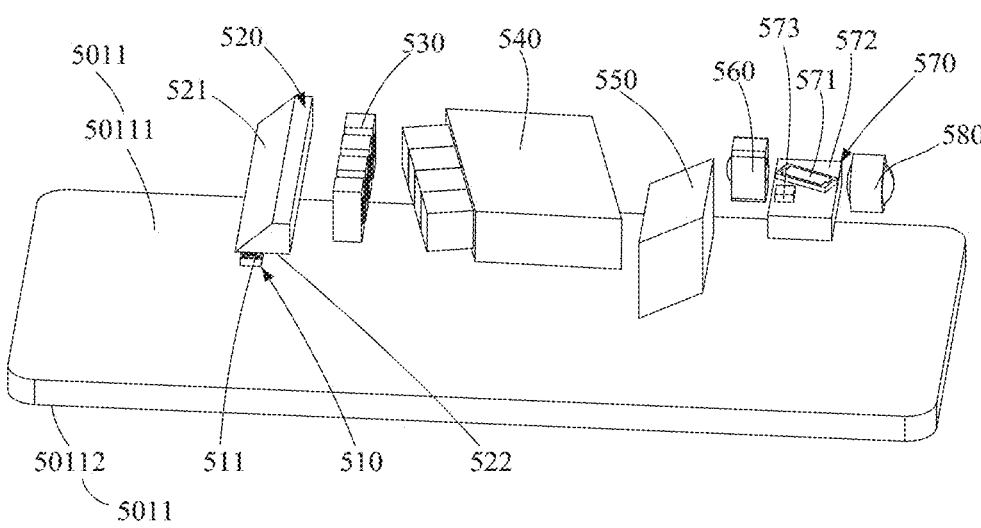
FIG. 8A is a diagram showing an internal structure of a light receiving assembly in an optical module, in accordance with some embodiments.
Figure 8B:
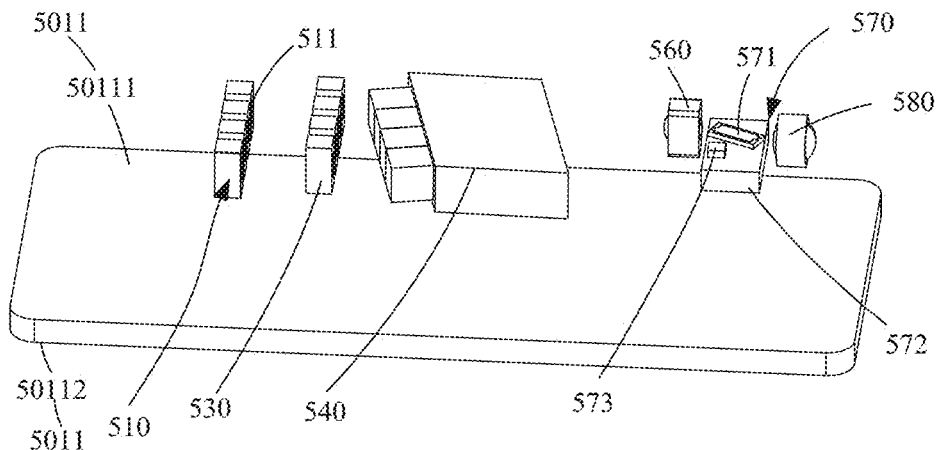
FIG. 8B is a diagram showing an internal structure of another light receiving assembly in an optical module, in accordance with some embodiments.

FIG. 8A is a diagram showing an internal structure of a light receiving assembly in an optical module, in accordance with some embodiments; and FIG. 8B is a diagram showing an internal structure of another light receiving assembly in an optical module, in accordance with some embodiments. As shown in FIGS. 8A and 8B, the light receiving bottom plate 5011 has a mounting face 50111 and a bottom surface 50112. The mounting face 50111 of the light receiving bottom plate 5011 faces an interior of the light receiving cavity. Devices such as the light receiving chip 510, the reflecting prism 520, the lens group 530, the DeMUX assembly 540, the shift prism 550, the first lens 560, the optical amplification assembly 570 and the second lens 580 are all mounted on the mounting face 50111 of the light receiving bottom plate 5011. The bottom surface 50112 of the light receiving bottom plate 5011 is a surface opposite to the mounting face 5011 thereof.

The light receiving chip 510 is disposed at a position of the light receiving bottom plate 5011 proximate to the electrical connector 800. The light receiving chip 510 has a photosensitive surface 511. The light receiving chip 510 is configured to receive an optical signal with one wavelength through the photosensitive surface 511 thereof and convert the optical signal into a current signal to be transmitted to the electrical connector 800. Common light receiving chips are PIN photodiodes or avalanche photodiodes (APDs). The light receiving assembly 500 includes a plurality of light receiving chips 510 disposed inside the light receiving cavity; and the plurality of light receiving chips 510 are arranged in an array on the mounting face 50111 of the light receiving bottom plate 5011 for receiving optical signals with a plurality of different wavelengths. In this way, optical signals with a plurality of different wavelengths from the outside of the optical module 200 are transmitted into the light receiving cavity through the first fiber optic adapter assembly 600. The above optical signals with different wavelengths are split into different light beams according to wavelengths after being reflected and refracted by various optical devices inside the light receiving cavity, the optical signals split into different light beams according to wavelengths are transmitted to the photosensitive surfaces 511 of corresponding light receiving chips 510 respectively, and the light receiving chips 510 receive the optical signals split into different light beams according to wavelengths through the photosensitive surfaces 511 thereof and convert the optical signals into current signals. It will be noted that the number of light receiving chips 510 is not limited in the present disclosure, and may be 2, 4, or 8. For example, as shown in FIGS. 8A and 8B, four light receiving chips are provided inside the light receiving cavity of the light receiving assembly 500 for receiving optical signals with four different wavelengths. In addition, a position of the photosensitive surface 511 in the light receiving chip 510 is not limited in the present disclosure. For example, as shown in FIG. 8A, the photosensitive surface 511 of the light receiving chip 510 is a surface of the light receiving chip 510 away from the light receiving bottom plate 5011; alternatively, as shown in FIG. 8B, the photosensitive surface 511 of the light receiving chip 510 is a surface of the light receiving chip 510 away from the electrical connector 800.

In some embodiments, the light receiving assembly 500 further includes a metallized ceramic substrate. The metallized ceramic substrate is disposed on the mounting face 50111 of the light receiving bottom plate 5011, and the light receiving chip 510 is disposed on a surface of the metallized ceramic substrate away from the light receiving bottom plate 5011. The metallized ceramic substrate has a circuit pattern on the surface of the metallized ceramic substrate away from the light receiving bottom plate 5011. The light receiving chip 510 is electrically connected to the circuit pattern on the metallized ceramic substrate and is electrically connected to the electrical connector 800 through the metallized ceramic substrate. The DeMUX assembly 540 is disposed at a side of the light receiving chip 510 away from the electrical connector 800 and is configured to split the optical signals into different light beams according to different wavelengths of the optical signals. For example, a beam of optical signals including a plurality of wavelengths enters the DeMUX assembly 540, and the optical signals with different wavelengths are reflected different times inside the DeMUX assembly 540, so that the optical signals with different wavelengths are split into different light beams.

Figure 9:
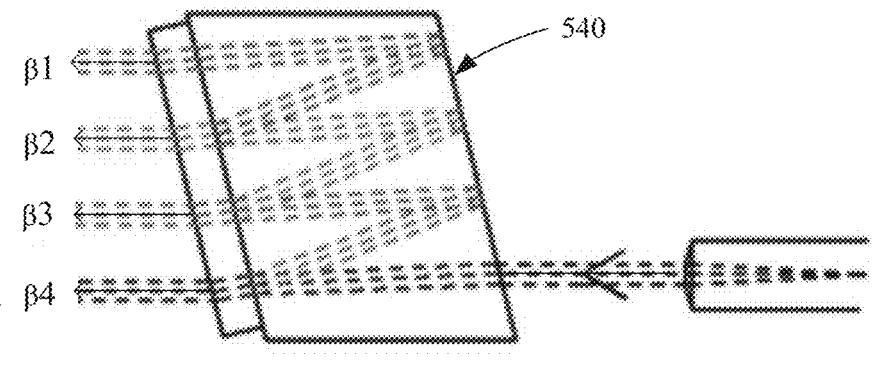
FIG. 9 is an optical path diagram of a demultiplexing assembly in an optical module, in accordance with some embodiments.

FIG. 9 is an optical path diagram of a DeMUX assembly in an optical module, in accordance with some embodiments. As shown in FIGS. 8A, 8B, and 9, the DeMUX assembly 540 has a light input end and a light output end. The light output end of the DeMUX assembly 540 faces the light receiving chip 510; and the light input end of the DeMUX assembly 540 is an end opposite to the light output end thereof. The DeMUX assembly 540 includes a light inlet for receiving light with various wavelengths. The light inlet is located at the light input end (a right end in FIG. 9) at a side of the DeMUX assembly 540 away from the light receiving chip 510. The DeMUX assembly 540 further includes a plurality of light outlets for emitting light, each of which is used to emit light with one wavelength. The light outlets are located at the light output end (a left end in FIG. 9) at a side of the DeMUX assembly 540 proximate to the light receiving chip 510. The number of light outlets is equal to the number of beams of light with various wavelengths.

By taking an example in which the DeMUX assembly 540 emits light with four different wavelengths, i.e., $\beta1$, $\beta2$, $\beta3$, and $\beta4$, and the DeMUX assembly 540 includes four light outlets, i.e., a first light outlet, a second light outlet, a third light outlet, and a fourth light outlet, respectively, the light with four different wavelengths enters the DeMUX assembly 540 through the light inlet of the DeMUX assembly 540. That is, light with the wavelength $\beta1$ is reflected multiple times (e.g., six times) at a plurality of (e.g., six) different positions in the DeMUX assembly 540 to reach the first light outlet; light with the wavelength $\beta2$ is reflected multiple times (e.g., four times) at a plurality of (e.g., four) different positions in the DeMUX assembly 540 to reach the second light outlet; light with the wavelength $\beta3$ is reflected multiple times (e.g., twice) at a plurality of (e.g., two) different positions in the DeMUX assembly 540 to reach the third light outlet; and light with the wavelength $\beta4$ enters the DeMUX assembly 540 and reaches the fourth light outlet directly without being reflected. In this way, through the DeMUX assembly 540, light with different wavelengths is input through the same light inlet and is output through different light outlets, thereby splitting light with different wavelengths into different light beams. The DeMUX assembly 540 transmits and reflects light with different wavelengths by using different film layers disposed at two sides and different positions of the DeMUX assembly 540, so as to split a beam of optical signals into a plurality of beams of optical signals with different wavelengths.

In some embodiments, as shown in FIG. 8A, the reflecting prism 520 is disposed on a side of the light receiving chip 510 away from the light receiving bottom plate 5011 and is configured to change a propagation direction of light. The reflecting prism 520 has a reflective surface 521 and a bottom surface 522. The bottom surface 522 of the reflecting prism 520 faces the light receiving chip 510, the reflective surface 521 of the reflecting prism 520 intersects the bottom surface 522 thereof, and an included angle between the reflective surface 521 and the bottom surface 522 is an acute angle. An orthogonal projection of the reflective surface 521 on the light receiving bottom plate 5011 covers orthogonal projections of the plurality of light receiving chips 510 on the light receiving bottom plate 5011, and the reflective surface 521 is able to change the propagation direction of light, for example, the reflective surface 521 turns the propagation direction of light by 90°. For example, as shown in FIG. 8A, the photosensitive surface 511 of the light receiving chip 510 faces the bottom surface 522 of the reflecting prism 520. In this case, the light split into different light beams by the DeMUX assembly 540 is incident on the reflecting prism 520, the light incident on the reflecting prism 520 is parallel to the photosensitive surface 511 of the light receiving chip 510, and the reflective surface 521 of the reflecting prism 520 reflects the light parallel to the photosensitive surface 511 of the light receiving chip 510 as light perpendicular to the photosensitive surface 511 of the light receiving chip 510, so that the light receiving chip 510 can receive an optical signal smoothly.

In some embodiments, the reflecting prism 520 may be omitted. For example, as shown in FIG. 8B, the photosensitive surface 511 of the light receiving chip 510 faces the light output end of the DeMUX assembly 540, and in this case, the light split into different light beams by the DeMUX assembly 540 does not need to be reflected by the reflecting prism 520, but is directly incident on the photosensitive surface 511 of the light receiving chip 510, and then the light receiving chip 510 can receive an optical signal smoothly.

The first lens 560 is disposed at a position proximate to the light inlet of the DeMUX assembly 540, i.e., on a side of the DeMUX assembly 540 away from the light receiving chip 510. In some embodiments, the first lens 560 is a collimating lens, and an optical signal collimated by the first lens 560 is transmitted to the light inlet of the DeMUX assembly 540, so as to ensure a coupling efficiency of the optical signal to the DeMUX assembly 540.

In some embodiments, as shown in FIG. 8A, the lens group 530 is located between the DeMUX assembly 540 and the reflecting prism 520, and is configured to receive a plurality of beams of optical signals with different wavelengths output by the DeMUX assembly 540, convert the plurality of beams of optical signals with different wavelengths into converging beams, and transmit the converging beams to the reflecting prism 520. For example, the photosensitive surface 511 of the light receiving chip 510 faces the bottom surface 522 of the reflecting prism 520.

In some embodiments, as shown in FIG. 8B, the lens group 530 is located between the DeMUX assembly 540 and the light receiving chip 510, and is configured to receive a plurality of beams of optical signals with different wavelengths output by the DeMUX assembly 540, convert the plurality of beams of optical signals with different wavelengths into converging beams, and transmit the converging beams to the light receiving chips 510. For example, the photosensitive surface 511 of the light receiving chip 510 faces the lens group 530.

It will be noted that a structural form of the lens group 530 is not limited. The lens group 530 may take the form of a structure in which a plurality of lenses are arranged side by side, so that the lens group 530 includes a plurality of lenses, and each lens corresponds to one light outlet of the DeMUX assembly 540, that is, each lens correspondingly focuses and transmits an optical signal with one wavelength. Alternatively, the lens group 530 may take the form of a structure in which a plurality of protrusions are disposed on a lens body, so that the lens group 530 includes the lens body and the plurality of protrusions disposed on the lens body. Each protrusion corresponds to one light outlet of the DeMUX assembly 540, and the plurality of protrusions are used to converge light beams, that is, each protrusion correspondingly focuses and transmits an optical signal with one wavelength. The number of lenses or protrusions in the lens group 530 is equal to the number of light receiving chips 510.

The optical amplification assembly 570 is disposed in the light receiving cavity and proximate to the first opening 5013, i.e., on a side of the first lens 560 away from the DeMUX assembly 540. The optical amplification assembly 570 is configured to amplify the optical signal transmitted into the light receiving cavity and transmit the amplified optical signal to the DeMUX assembly 540. An arrangement of the optical amplification assembly 570 can meet a sensitivity requirement of the optical module 200 in long-distance (40-kilometer or 80-kilometer) transmission scenarios.

In some embodiments, the second lens 580 is disposed on a side of the optical amplification assembly 570 away from the first lens 560, and is configured to receive an optical signal from the first fiber optic adapter assembly 600 and transmit the optical signal to the optical amplification assembly 570. In this case, the optical amplification assembly 570 is located between the second lens 580 and the first lens 560, that is, both sides of the optical amplification assembly 570 are provided with corresponding lenses. Since a space size inside the light receiving cavity is limited, providing the optical amplification assembly 570 between the second lens 580 and the first lens 560 can reasonably utilize space between the two lenses, and ensure that the space of the light receiving cavity is not increased. If the optical amplification assembly 570 is disposed at another position, a state of the optical signal changes since the optical signal output by the optical amplification assembly 570 is a divergent light beam, and a lens needs to be added to change the state of the optical signal, which in turn will increase the space size of the light receiving cavity. In some embodiments, the second lens 580 may be omitted.

It will be noted that the type of the second lens 580 is not limited in the present disclosure. In some embodiments, in a case where a lens (i.e., a collimating lens) is provided in the adapter connector 602 of the first fiber optic adapter assembly 600, an optical signal coupled out by the first fiber optic adapter assembly 600 is a collimated light beam, and then the second lens 580 is a collimating lens. The collimated light beam output by the first fiber optic adapter assembly 600 is collimated again and coupled into the optical amplification assembly 570, and the first lens 560 is a collimating lens for converting the divergent light beam output by the optical amplification assembly 570 into a collimated light beam. The lens group 530 includes a plurality of converging lenses for converting the collimated light beams output by the DeMUX assembly 540 into converging light beams. In a case where no lens is provided in the adapter connector 602 of the first fiber optic adapter assembly 600, the second lens 580 is a converging lens for converting the divergent light beam output by the first fiber optic adapter assembly 600 into a converging light beam; the first lens 560 is a collimating lens for converting the divergent light beam output by the optical amplification assembly 570 into a collimated light beam; and the lens group 530 includes a plurality of converging lenses for converting the collimated light beams output by the DeMUX assembly 540 into converging light beams.

In some embodiments, a distance between a central axis of the light inlet of the DeMUX assembly 540 and a central axis of the first fiber optic adapter assembly 600 is long, and therefore, a shift prism 550 needs to be provided in the light receiving assembly 500. The shift prism 550 is configured to adjust the distance between the central axis of the light inlet of the DeMUX assembly 540 and the central axis of the first fiber optic adapter assembly 600 to achieve movement of optical axes. The shift prism 550 may be located at a position proximate to the light inlet of the DeMUX assembly 540, for example, may be located between the DeMUX assembly 540 and the first lens 560 (referring to FIG. 8A). The shift prism 550 may also be located at a position proximate to the first fiber optic adapter assembly 600, for example, may be located between the second lens 580 and the first fiber optic adapter assembly 600. A position of the shift prism 550 is not limited in the present disclosure, as long as the shift prism 550 can realize movement of the central axis of the light inlet of the DeMUX assembly 540 and the central axis of the first fiber optic adapter assembly 600 to make the distance between the central axes meet the requirements, which shall all be within the protection scope of the embodiments of the present disclosure. In some embodiments, the shift prism 550 may be omitted.

FIG. 10A is a structural diagram of a light receiving assembly in an optical module with a light receiving upper cover removed, in accordance with some embodiments; and FIG. 10B is a sectional view of the light receiving assembly shown in FIG. 10A. As shown in FIGS. 10A and 10B, in some embodiments, the light receiving assembly 500 further includes a transimpedance amplifier 590. The transimpedance amplifier 590 is disposed at a side of the light receiving chip 510. The transimpedance amplifier 590 is electrically connected to the light receiving chip 510, and is configured to convert a current signal output by the light receiving chip 53 into a voltage signal. For example, the transimpedance amplifier 590 is connected to the light receiving chip 510 through a wire bonding process. In some embodiments, in order to facilitate control of a length of a connecting line between the light receiving chip 510 and the transimpedance amplifier 590, the transimpedance amplifier 590 is disposed proximate to the light receiving chip 510. The transimpedance amplifier 590 is further electrically connected to the electrical connector 800. In some embodiments, in order to facilitate electrical connection between the transimpedance amplifier 590 and the electrical connection 800, the transimpedance amplifier 590 is disposed proximate to the electrical connector 800. Therefore, as shown in FIGS. 10A and 10B the transimpedance amplifier 590 is disposed at a right side of the light receiving chip 510, that is, the transimpedance amplifier 590 is located between the light receiving chip 510 and the electrical connector 800.

The light receiving assembly 500 further includes an isolator 5100 disposed inside the light receiving cavity and proximate to the first opening 5013. The isolator 5100 is configured to transmit an optical signal entering the light receiving cavity through the first fiber optic adapter assembly 600 and prevent the optical signal transmitted to the isolator 5100 through reflection from passing through, so that an optical signal to be received is prevented from being contaminated by the reflected optical signal during transmission to ensure quality of the optical signal to be received.

In some embodiments, the optical amplification assembly 570 is disposed between the isolator 5100 and the first lens 560. In this way, the optical signal transmitted through the isolator 5100 is transmitted to the optical amplification assembly 570, and the optical signal amplified by the optical amplification assembly 570 is transmitted to the first lens 560. In some embodiments, in a case where the light receiving assembly 500 includes the second lens 580, the second lens 580 is disposed between the isolator 5100 and the optical amplification assembly 570. In this way, the optical signal transmitted through the isolator 5100 is transmitted to the second lens 580, and then transmitted to the optical amplification assembly 570 through the second lens 580.

In some embodiments, as shown in FIGS. 8A and 8B, the optical amplification assembly 570 includes a semiconductor optical amplifier (SOA) 571. The SOA 571 is disposed on an optical axis from the second lens 580 to the first lens 560. The SOA 571 performs amplification gain on an optical signal according to a magnitude of a driving current applied thereto. In a case where the currents applied to the SOA 571 are different, amplification gains of the optical signal are different, and therefore, an amplification gain multiple of the SOA 571 may be controlled and adjusted by controlling the magnitude of the driving current applied to the SOA 571.

Figure 10C:
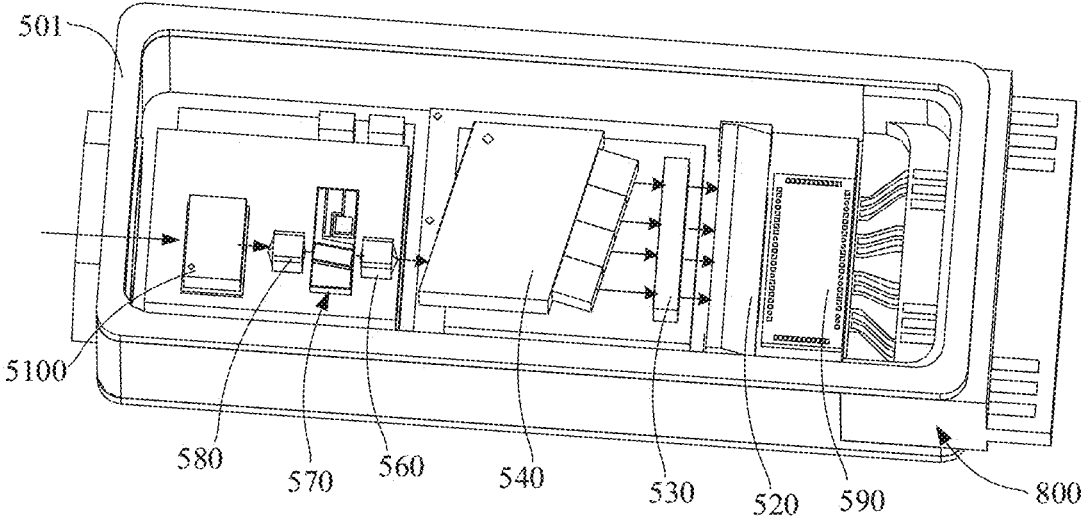
FIG. 10C is an optical path diagram of the light receiving assembly shown in FIG. 10A.
Figure 11A:
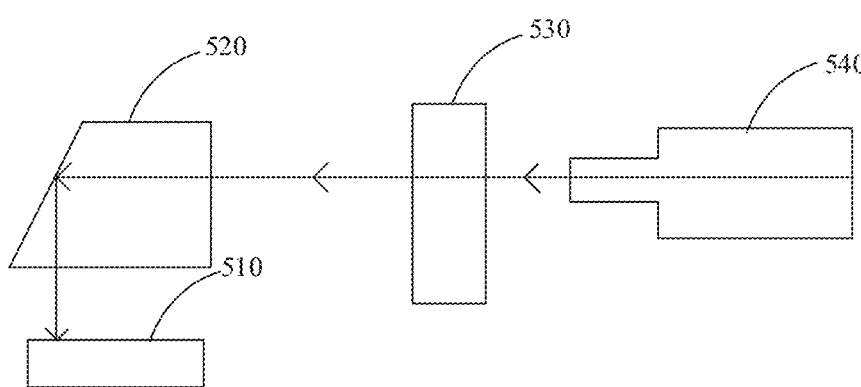
FIG. 11A is a partial optical path diagram of the light receiving assembly shown in FIG. 8A.

FIG. 10C is an optical path diagram of the light receiving assembly shown in FIG. 10A, and FIG. 11A is a partial optical path diagram of the light receiving assembly shown in FIG. 8A. Arrows shown in FIG. 10C pointing from the isolator 5100 to the transimpedance amplifier 590 show a transmission path of an optical signal from the outside of the optical module 200 in the light receiving assembly 500. As shown in FIGS. 10C and 11A, in some embodiments, a multi-wavelength optical signal from the outside of the optical module 200 is transmitted to the isolator 5100 through the first fiber optic adapter assembly 600, and the optical signal transmitted through the isolator 5100 is transmitted to the second lens 580. The optical signal is transmitted to the SOA 571 of the optical amplification assembly 570 after being collimated or converged by the second lens 580, and the optical signal is transmitted to the first lens 560 after being amplified by the SOA 571 of the optical amplification assembly 570. The optical signal is transmitted to the DeMUX assembly 540 after being collimated by the first lens 560, and the optical signal transmitted to the DeMUX assembly 540 is split into four beams of optical signals according to optical wavelengths. The four beams of optical signals are transmitted to the lens group 530, and the four beams of optical signals are converged and transmitted to the reflecting prism 520, and finally are transmitted to the photosensitive surface 511 of the light receiving chip 510 (shielded by the reflecting prism 520) after a transmission direction of the optical signals is changed by the reflecting prism 520. In the embodiments of the present disclosure, the SOA 571 is reasonably integrated into the light receiving assembly 500 of the optical module 200, and is connected to other devices well, so as to realize power amplification of an optical signal received in the optical receiving cavity, and to obtain an optical module 200 with a high sensitivity and long-distance transmission finally.

Figure 11B:
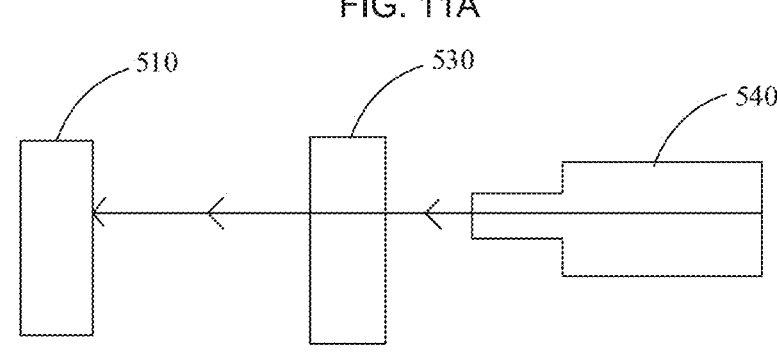
FIG. 11B is a partial optical path diagram of the light receiving assembly shown in FIG. 8B.

FIG. 11B is a partial optical path diagram of the light receiving assembly shown in FIG. 8B. As shown in FIG. 11B, in some embodiments, the optical signal transmitted to the DeMUX assembly 540 is split into four beams of optical signals according to optical wavelengths, and the four beams of optical signals are transmitted to the lens group 530 and are respectively converged and transmitted to the photosensitive surfaces 511 of the light receiving chips 510 without passing through the reflecting prism 520.

Figure 12:
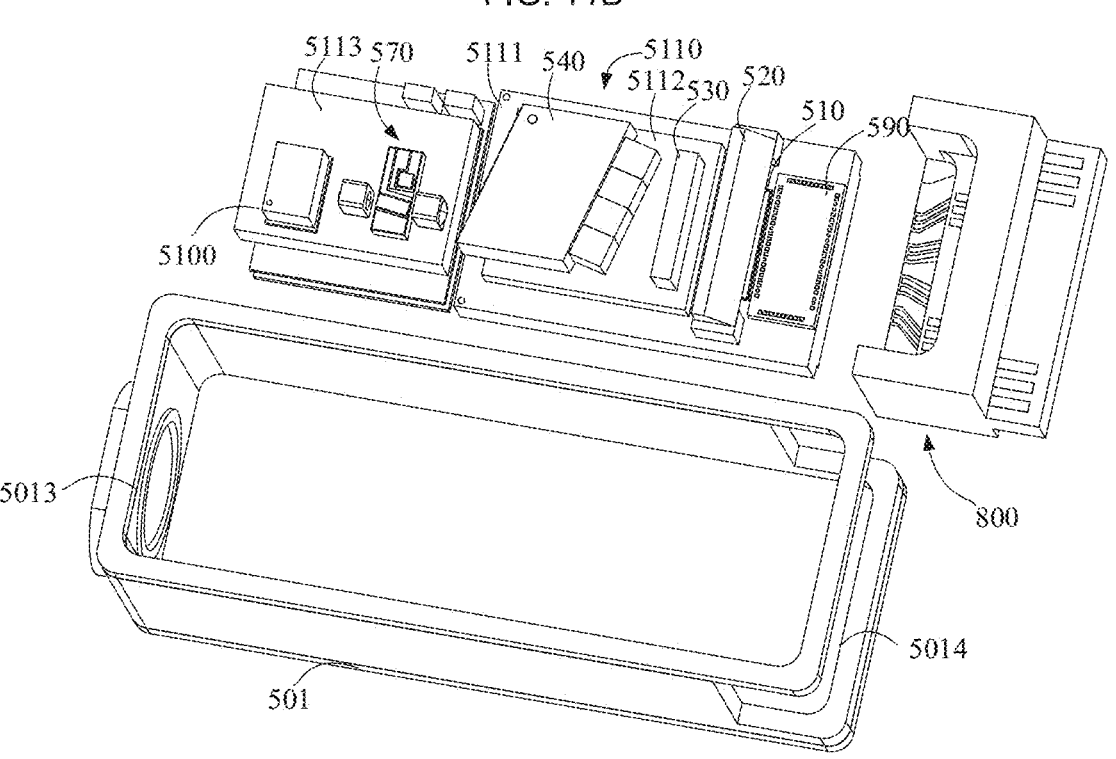
FIG. 12 is an exploded view of the light receiving assembly shown in FIG. 10A.

FIG. 12 is an exploded view of the light receiving assembly shown in FIG. 10A. As shown in FIG. 12, in order to facilitate arrangements of the light receiving chip 510, the transimpedance amplifier 590, the DeMUX assembly 540, the lens group 530, the reflecting prism 520, etc. in the light receiving lower shell 501, in some embodiments, the light receiving assembly 500 further includes a substrate assembly 5110. The light receiving chip 510, the transimpedance amplifier 590, the DeMUX assembly 540, the lens group 530, the reflecting prism 520, etc. are disposed on the substrate assembly 5110, and the substrate assembly 5110 is disposed on the light receiving bottom plate 5011 of the light receiving lower shell 501. During assembly of the light receiving assembly 500, the light receiving chip 510, the transimpedance amplifier 590, the DeMUX assembly 540, the lens group 530, the reflecting prism 520, etc. are first assembled onto the substrate assembly 5110, and then the substrate assembly 5110 is assembled onto the light receiving bottom plate 5011 of the light receiving lower shell 501. In addition to facilitating installation of the light receiving chip 510, the transimpedance amplifier 590, the DeMUX assembly 540, the lens group 530, the reflecting prism 520, etc. in the light receiving lower shell 501, the substrate assembly 5110 also facilitates adjustment of relative heights of the light receiving chip 510, the transimpedance amplifier 590, the DeMUX assembly 540, the lens group 530, the reflecting prism 520, etc., thereby ensuring a transmission direction and a coupling efficiency of the optical signal to be received.

Figure 13A:
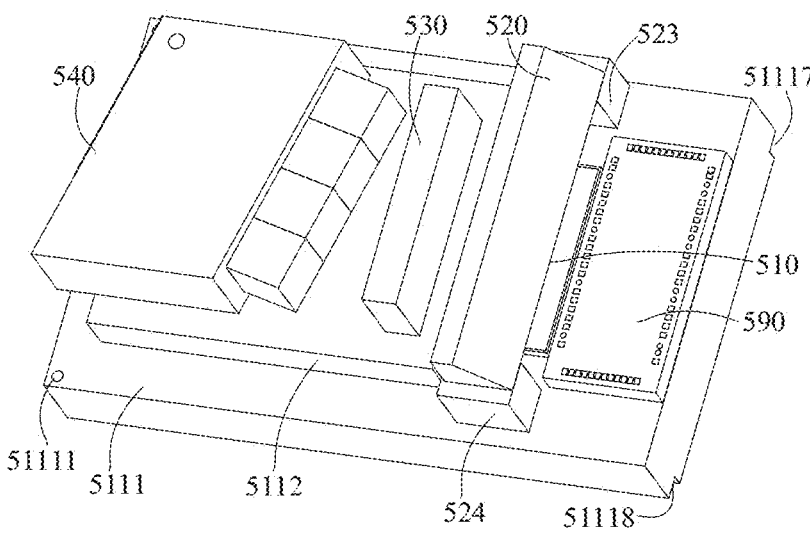
FIG. 13A is a structural diagram of a first substrate and a second substrate in a use state in the light receiving assembly shown in FIG. 10A.

FIG. 13A is a structural diagram of a first substrate and a second substrate in a use state in the light receiving assembly shown in FIG. 10A. As shown in FIGS. 12 and 13A, in some embodiments, the substrate assembly 5110 includes a first substrate 5111 and a second substrate 5112. The second substrate 5112 is disposed on the first substrate 5111, and a size of the second substrate 5112 is smaller than a size of the first substrate 5111 such that the first substrate 5111 is configured to bear the second substrate 5112. The light receiving chip 510, the transimpedance amplifier 590, and the reflecting prism 520 are disposed on the first substrate 5111. The DeMUX assembly 540 and the lens group 530 are disposed on the second substrate 5112. In an aspect, the second substrate 5112 is configured to bear the DeMUX assembly 540 and the lens group 530, and in another aspect, the second substrate 5112 facilitates adjustment of the optical path during an optical path coupling process to ensure a coupling efficiency of an optical path to be received.

In some embodiments, the first substrate 5111 is disposed on the light receiving bottom plate 5011 of the light receiving lower shell 501, that is, the first substrate 5111 is connected to the light receiving bottom plate 5011 of the light receiving lower shell 501. To facilitate assembly of the first substrate 5111 on the light receiving lower shell 501, as shown in FIG. 13A, the first substrate 5111 has a first unfilled corner 51117 and a second unfilled corner 51118. The first unfilled corner 51117 and the second unfilled corner 51118 are both disposed at an edge of a surface of the first substrate 5111 proximate to the light receiving bottom plate 5011 and are arranged in a width direction of the first substrate 5111. The first unfilled corner 51117 and the second unfilled corner 51118 are used such that a bottom of the first substrate 5111 dodges the light receiving side plates 5012 of the light receiving lower shell 501, which facilitates the assembly of the first substrate 5111.

In some embodiments, as shown in FIG. 13A, in order to facilitate assembly of the reflecting prism 520 and prevent the assembly of the reflecting prism 520 from interfering with assembly of structures such as the light receiving chip 510, the light receiving assembly 500 further includes a first support block 523 and a second support block 524 disposed on the first substrate 5111. The first support block 523 is disposed on a side of the light receiving chip 510, and the second support block 524 is disposed on the other side of the light receiving chip 510. The first support block 523 supports an end of the reflecting prism 520, and the second support block 524 supports the other end of the reflecting prism 520, and thus the first support block 523 and the second support block 524 are used to raise the reflecting prism 520, so that the reflecting prism 520 is located above the light receiving chip 510 and on an optical path of light to be received. The reflecting prism 520 may be fixed on the first support block 523 and the second support block 524 with glue. For example, the reflecting prism 520 is fixedly disposed on the first support block 523 and the second support block 524 through a dispensing process, so that the reflecting prism 520 is supported by the first support block 523 and the second support block 524, which may facilitate the fixing of the reflecting prism 520 and effectively prevent the glue from contaminating the devices such as the light receiving chip 510. In some embodiments, the first support block 523 and the second support block 524 may be square columns made of an insulating material such as plastic and glass. In some embodiments, the isolator 5100, the optical amplification assembly 570, etc. may also be disposed on the first substrate 5111 or the second substrate 5112 to facilitate assembly and optical path coupling of the isolator 5100, the optical amplification assembly 570, etc.

In some embodiments, the second substrate 5112, the light receiving chip 510, the transimpedance amplifier 590, etc. are fixedly connected to the first substrate 5111 by a surface mounting method. In order to ensure an accuracy of surface mounting of the second substrate 5112, the light receiving chip 510, the transimpedance amplifier 590, etc. on the first substrate 5111, the first substrate 5111 has a mark point 51111 for visual identification of the high-accuracy surface mounting of the first substrate 5111. For example, the mark point 51111 may be an O-shaped, L-shaped, or +-shaped mark point. In FIG. 13A, the mark point 51111 is an O-shaped mark point. The mark point 51111 may be disposed by printing on an edge of a surface of the first substrate 5111 away from the light receiving bottom plate 5011.

Figure 13B:
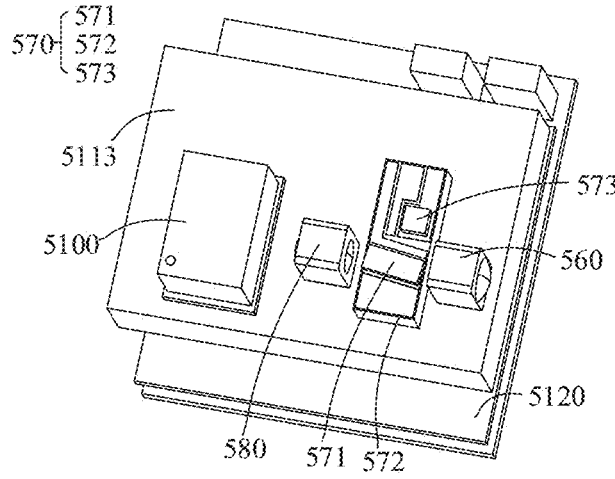
FIG. 13B is a structural diagram of a third substrate in a use state in the light receiving assembly shown in FIG. 10A.

FIG. 13B is a structural diagram of a third substrate in a use state in the light receiving assembly shown in FIG. 10A. In some embodiments, the substrate assembly 5110 further includes a third substrate 5113, and the isolator 5100, the optical amplification assembly 570, the second lens 580, the first lens 560, etc. are disposed on the third substrate 5113. In this way, providing the isolator 5100, the optical amplification assembly 570, etc. on a substrate different from a substrate on which the DeMUX assembly 540, etc. is provided facilitates adjustment of relative heights of the devices, thereby facilitating adjustment of optical path coupling to ensure an optical path coupling efficiency.

In an operating process of the SOA 571 in the optical amplification assembly 570, in a case where an optical amplification gain of the SOA 571 is stabilized at a certain fixed value, a stable driving current needs to be applied to the SOA 571. In addition, since the SOA 571 is susceptible to temperature, optical amplification gains of the SOA 571 are different at the same driving current and different temperatures. Therefore, in order to determine the optical amplification gain of the SOA 571, the SOA 571 needs to be maintained within a certain temperature range, and then the SOA 571 may have a good operating performance. Therefore, in some embodiments, as shown in FIGS. 12 and 13B, the light receiving assembly 500 further includes a thermo electric cooler (TEC) 5120 for stabilizing an operating temperature of the SOA 571.

The isolator 5100, the optical amplification assembly 570, the second lens 580, and the first lens 560 are disposed on the third substrate 5113, and the third substrate 5113 is disposed on the TEC 5120. The TEC 5120 is fixed on the light receiving bottom plate 5011 of the light receiving lower shell 501, so that the isolator 5100, the optical amplification assembly 570, the second lens 580, and the first lens 560 are disposed inside the light receiving cavity. The isolator 5100, the optical amplification assembly 570, the second lens 580, and the first lens 560 are disposed on the TEC 5120 through a common substrate, so that the third substrate 5113 has the same influence on the isolator 5100, the optical amplification assembly 570, the second lens 580, and the first lens 560 when the third substrate 5113 is deformed due to a temperature change, thereby ensuring stability of transmission optical paths of the isolator 5100, the second lens 580, the optical amplification assembly 570, and the first lens 560.

As shown in FIG. 13B, in some embodiments, the optical amplification assembly 570 further includes a fourth substrate 572, on which the SOA 571 is disposed. A surface of the fourth substrate 572 is formed with a circuit pattern, and the SOA 571 is electrically connected to the circuit pattern of the fourth substrate 572 to facilitate application of a driving current to the SOA 571 through the fourth substrate 572. For example, the fourth substrate 572 may be a ceramic substrate, and a surface of the ceramic substrate forms a circuit pattern for electrically connecting the SOA 571. To bear the SOA 571, in some embodiments, the SOA 571 is mounted on the fourth substrate 572, and a positive electrode of the SOA 571 is connected to the circuit pattern of the fourth substrate 572 through a connecting line.

In some embodiments, in order to ensure normal operation of the SOA 571, the operating temperature of the SOA 571 needs to be monitored, and thus the optical amplification assembly 570 further includes a temperature sensor 573, which is disposed around the SOA 571 for collecting a temperature of the SOA 571 in real time to facilitate temperature control of the SOA 571. There is a certain relationship between a resistance value of the temperature sensor 573 and the operating temperature of the SOA 571. By monitoring the resistance value of the temperature sensor 573, change in the operating temperature of the SOA 571 may be monitored, and then the operating temperature of the SOA 571 can be adjusted by adjusting a magnitude of a current of the TEC 5120. In a case where the magnitude of the current of the TEC 5120 changes, the operating temperature of the SOA 571 changes accordingly until the temperature of the SOA 571 is adjusted to a normal operating temperature.

Figure 14:
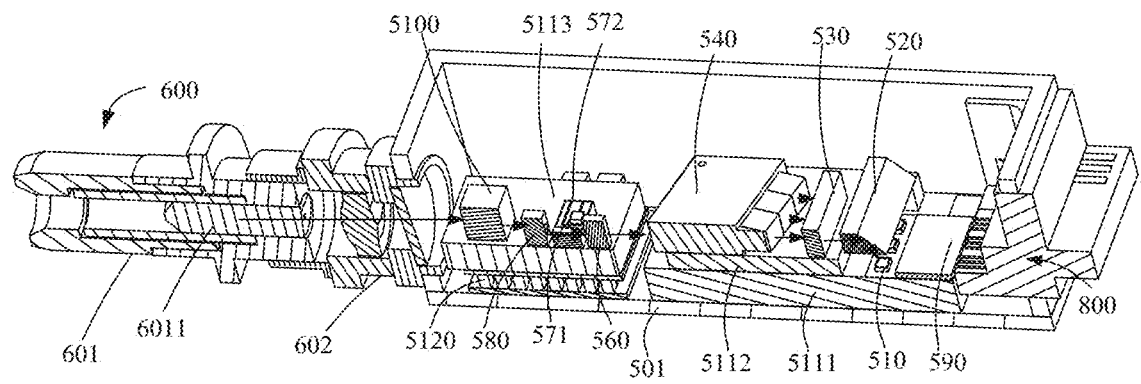
FIG. 14 is a sectional and optical path diagram of the light receiving assembly shown in FIG. 10A from another angle.

In some embodiments, the temperature sensor 573 is disposed on the fourth substrate 572, and the surface of the fourth substrate 572 is formed with a circuit pattern for electrically connecting the temperature sensor 573. In some embodiments, the temperature sensor 573 may be a thermistor mounted on the fourth substrate 572 and electrically connected to the circuit pattern of the fourth substrate 572. FIG. 14 is a sectional and optical path diagram of the light receiving assembly shown in FIG. 10A from another angle. As shown in FIG. 14, the TEC 5120 and the first substrate 5111 are disposed in the light receiving lower shell 501, that is, bottoms of the TEC 5120 and the first substrate 5111 are fixed on the light receiving bottom plate 5011 of the light receiving lower shell 501. The TEC 5120 is proximate to an end of the light receiving lower shell 501 connected to the first fiber optic adapter assembly 600, that is, the TEC 5120 is proximate to the first opening 5013. The first substrate 5011 is proximate to an end of the light receiving lower shell 501 connected to the electrical connector 800, that is, first substrate 5011 is proximate to the second opening 5014. The third substrate 5113 is disposed on a surface of the TEC 5120 away from the light receiving bottom plate 5011, and the isolator 5100, the second lens 580, the optical amplification assembly 570, and the first lens 560 are disposed on the third substrate 5113; the second substrate 5112, the light receiving chip 510, the transimpedance amplifier 590, and the reflecting prism 520 are disposed on the first substrate 5111; and the DeMUX assembly 540 and the lens group 530 are disposed on the second substrate 5112. The first substrate 5111, the second substrate 5112, and the third substrate 5113 cooperatively bear devices such as the isolator 5100 and the second lens 580, which not only meets the requirements for relative mounting heights between the devices, but also facilitates the assembly of the devices in the light receiving cavity.

Figure 15:
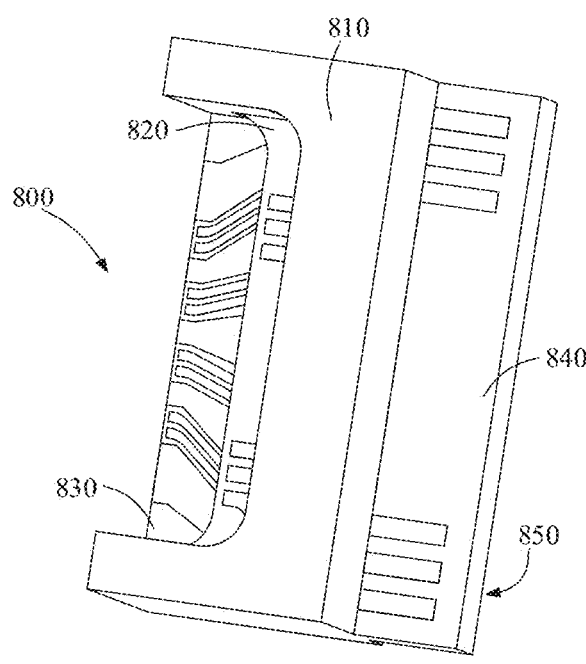
FIG. 15 is a structural diagram of an electrical connector, in accordance with some embodiments.

FIG. 15 is a structural diagram of an electrical connector, in accordance with some embodiments. As shown in FIGS. 14 and 15, a first end (a left end in FIG. 15) of the electrical connector 800 extends into the light receiving cavity, and a second end thereof (a right end in FIG. 15) is located outside the light receiving cavity. The electrical connector 800 includes an electrical connector body 810 for embedding and connecting the second opening 5014, a first end (the left end in FIG. 15) of the electrical connector body 810 is configured to be electrically connected to the devices inside the light receiving cavity, and a second end (the right end in FIG. 15) of the electrical connector body 810 is configured to be electrically connected to the circuit board 300.

In some embodiments, the electrical connector 800 further includes a first step surface 820 and a second step surface 830. As shown in FIGS. 14 and 15, the first step surface 820 and the second step surface 830 are disposed at the first end of the electrical connector body 810 and are located at different heights at the first end of the electrical connector body 810. The first step surface 820 and the second step surface 830 form a mutually staggered step-like structure toward the light receiving upper cover 502, which facilitates electrical connection between the electrical connector 800 and the devices in the light receiving cavity.

The electrical connector 800 further includes a first connecting surface 840 and a second connecting surface 850 that are arranged opposite to each other. The first connecting surface 840 and the second connecting surface 850 are at the second end of the electrical connector body 810. For example, the first connecting surface 840 faces the light receiving upper cover 502, and the second connecting surface 850 faces the light receiving bottom plate 5011. The first connecting surface 840 and the second connecting surface 850 are configured to be connected to the circuit board 300. For example, the first connecting surface 840 and the second connecting surface 850 are electrically connected to the circuit board 300 through a flexible circuit board, respectively.

In some embodiments, as shown in FIG. 15, the electrical connector 800 includes direct current pins disposed on the first step surface 820, and the direct current pins are used for transmitting direct current signals and supplying power. The electrical connector 800 further includes alternating current pins and grounding pins disposed on the second step surface 830. The alternating current pins are used for transmitting alternating current signals, and the grounding pins are used for grounding. The electrical connector 800 further includes a plurality of pins disposed on the first connecting surface 840 and the second connecting surface 850, and the pins on the first connecting surface 840 and the second connecting surface 850 are configured to be electrically connected to the circuit board 300. Moreover, the direct current pins on the first step surface 820 are connected to the pins on the first connecting surface 840, and the alternating current pins and the grounding pins on the second step surface 830 are connected to the pins on the second connecting surface 850. In some embodiments, the direct current pins on the first step surface 820 are also configured to be connected to a positive electrode of the SOA 571, a positive electrode of the temperature sensor 573, and a positive electrode and a negative electrode of the TEC 5120; and the grounding pins on the second step surface 830 are also configured to be connected to a negative electrode of the SOA 571 and a negative electrode of the temperature sensor 573.

In some embodiments, the devices inside the light receiving cavity are connected to corresponding pins of the electrical connector 800 through connecting lines. For example, the transimpedance amplifier 590 is connected to corresponding pins of the electrical connector 800 through a wire bonding process.

In some embodiments, operation of the optical amplification assembly 570, the TEC 5120, etc. also requires power supply, and thus the optical amplification assembly 570, the TEC 5120, etc. need to be electrically connected to the electrical connector 800, so as to supply power to the optical amplification assembly 570, the TEC 5120, etc. through the electrical connector 800. However, the optical amplification assembly 570, the TEC 5120, etc. are relatively far away from the electrical connector 800 and there are devices such as the DeMUX assembly 540 between the optical amplification assembly 570, the TEC 5120, etc. and the electrical connector 800. As a result, it is not easy to realize a direct connection between the optical amplification assembly 570, the TEC 5120, etc. and corresponding pins of the electrical connector 800 through the wire bonding process, and an impedance between the optical amplification assembly 570, the TEC 5120, etc. and the electrical connector 800 is not easily limited if the optical amplification assembly 570, the TEC 5120, etc. are directly connected to corresponding pins of the electrical connector 800. Therefore, even though the optical amplification assembly 570, the TEC 5120, etc. may be electrically connected to the corresponding pins of the electrical connector 800 in the form of direct connection, electrical stability of the optical amplification assembly 570, the TEC 5120, etc. can hardly meet the requirements.

In order to meet the requirement of electrical connection between the optical amplification assembly 570, the TEC 5120, etc. and the electrical connector 800, in some embodiments, a substrate with a circuit pattern is used to perform a build-up connection between the optical amplification assembly 570, the TEC 5120, etc. and the electrical connector 800, and the substrate may be directly disposed in the light receiving cavity. For example, the substrate is disposed on the light receiving bottom plate 5011 of the light receiving lower shell 501 or elsewhere in the light receiving cavity, and the substrate has a corresponding metal layer to form the circuit pattern. An end of the substrate is electrically connected to the optical amplification assembly 570, the TEC 5120, etc., and the other end of the substrate is electrically connected to the electrical connector 800, so that the electrical connection between the optical amplification assembly 570, the TEC 5120, etc. and the electrical connector 800 is implemented through the substrate.

Figure 16A:
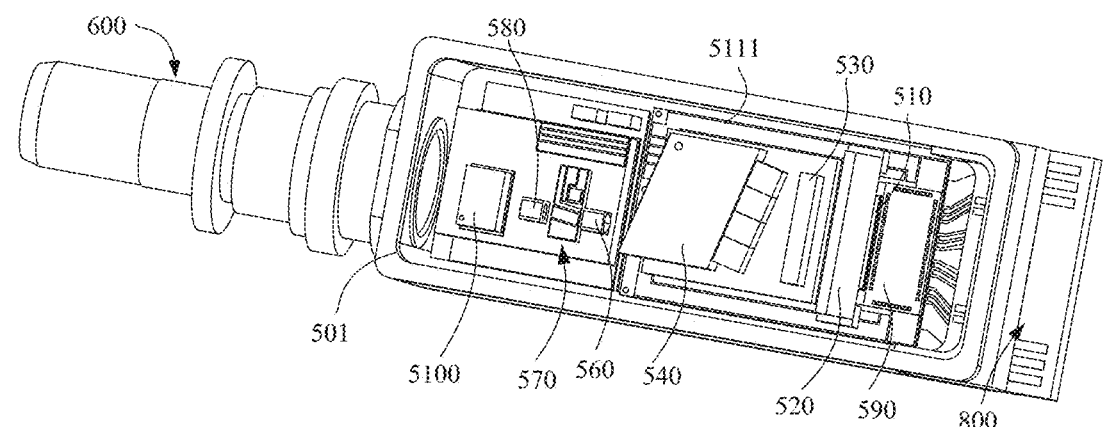
FIG. 16A is a structural diagram of another light receiving assembly with a light receiving upper cover removed, in accordance with some embodiments.
Figure 16B:
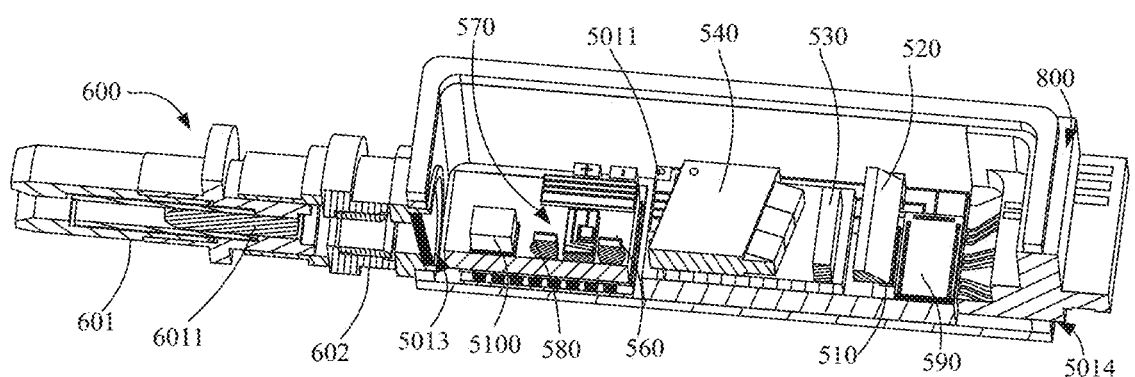
FIG. 16B is a sectional view of the light receiving assembly shown in FIG. 16A.

FIG. 16A is a structural diagram of another light receiving assembly with a light receiving upper cover removed, in accordance with some embodiments. FIG. 16B is a sectional view of the light receiving assembly shown in FIG. 16A. As shown in FIGS. 16A and 16B, the first substrate 5111 has a metal layer provided on a surface thereof, and the circuit pattern is formed through the metal layer for the electrical connection between the optical amplification assembly 570, the TEC 5120, etc. and the electrical connector 800. Of course, in some embodiments, a substrate separately used for implementing the electrical connection between the optical amplification assembly 570, the TEC 5120, etc. and the electrical connector 800 may also be provided, and the substrate is disposed in the light receiving cavity. Alternatively, the second substrate 5112 has a metal layer disposed on a surface thereof, and the electrical connection between the optical amplification assembly 570, the TEC 5120, etc. and the electrical connector 800 is implemented through the second substrate 5112. In addition, a circuit pattern may be formed inside the first substrate 5111 and pads are formed on a surface of the first substrate 5111, the first substrate 5111 and the electrical connector 800 are of a one-piece structure, pins at an end of the electrical connector 800 are electrically connected to the pads on the surface of the first substrate 5111 through the circuit pattern formed inside the first substrate 5111, and the optical amplification assembly 570, the TEC 5120, etc. are electrically connected to the pads of the first substrate 5111, so that the optical amplification assembly 570, the TEC 5120, etc. are electrically connected to the electrical connector 800.

The electrical connection between the optical amplification assembly 570, the TEC 5120, etc. and the electrical connector 800 through the first substrate 5111 will be described below by taking an example in which a metal layer is provided on the surface of the first substrate 5111 to form a circuit pattern.

Figure 17A:
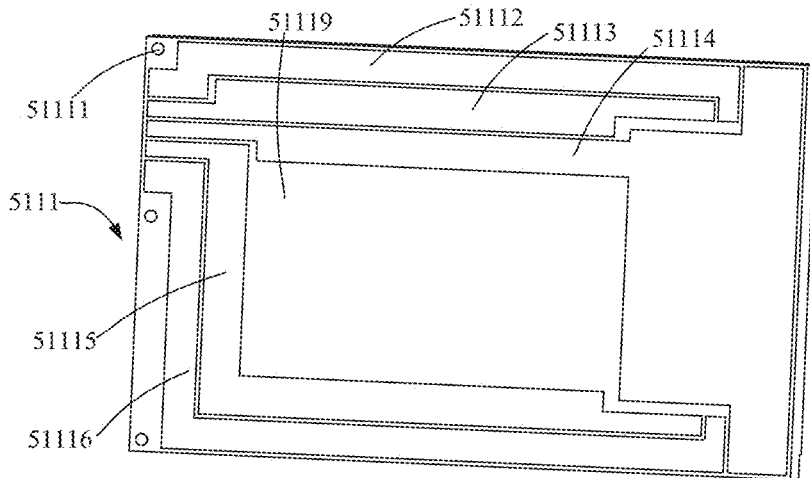
FIG. 17A is a structural diagram of a first substrate in the light receiving assembly shown in FIG. 16A.

FIG. 17A is a structural diagram of a first substrate in the light receiving assembly shown in FIG. 16A, and FIG. 17A shows a detailed structure in which the metal layer is provided on the surface of the first substrate 5111. Of course, a structure and shape of the metal layer provided on the surface of the first substrate 5111 in the embodiments of the present disclosure are not limited to the structure and shape shown in FIG. 17A. As shown in FIG. 17A, the first substrate 5111 has the metal layer provided on the surface thereof, and the metal layer of the first substrate 5111 extends from a first end of the first substrate 5111 to a second end of the first substrate 5111. The first end of the first substrate 5111 is proximate to the optical amplification assembly 570, the TEC 5120, etc., and the second end of the first substrate 5111 is proximate to the electrical connector 800. In some embodiments, the first substrate 5111 is a ceramic substrate, and a metal layer made of gold or copper is provided on a top surface (a surface facing away from the circuit board 300) of the ceramic substrate.

In some embodiments, as shown in FIG. 17A, the first substrate 5111 includes a first metal layer 51112, a second metal layer 51113, a third metal layer 51114, a fourth metal layer 51115, and a fifth metal layer 51116. The first metal layer 51112, the second metal layer 51113, the third metal layer 51114, the fourth metal layer 51115, and the fifth metal layer 51116 are disposed on a surface of the first substrate 5111 away from the light receiving bottom plate 5011. Since the pins of the optical amplification assembly 570, the TEC 5120, etc. are relatively concentrated, first ends of the first metal layer 51112, the second metal layer 51113, the third metal layer 51114, the fourth metal layer 51115, and the fifth metal layer 51116 are concentrated at the first end of the first substrate 5111; while the pins of the electrical connector 800 are relatively scattered, and thus second ends of the first metal layer 51112, the second metal layer 51113, the third metal layer 51114, the fourth metal layer 51115, and the fifth metal layer 51116 are relatively scattered. The first ends of the first metal layer 51112, the second metal layer 51113, the third metal layer 51114, the fourth metal layer 51115, and the fifth metal layer 51116 are generally electrically connected to the optical amplification assembly 570, the TEC 5120, etc. through connecting lines, and the second ends of the first metal layer 51112, the second metal layer 51113, the third metal layer 51114, the fourth metal layer 51115, and the fifth metal layer 51116 are electrically connected to the pins of the electrical connector 800 through connecting lines. In some embodiments, the first ends of the first metal layer 51112, the second metal layer 51113, the third metal layer 51114, the fourth metal layer 51115, and the fifth metal layer 51116 are arranged side by side at the first end of the first substrate 5111 in a width direction of the first substrate 5111.

In some embodiments, as shown in FIG. 17A, the first substrate 5111 further includes a blank region 51119. Middle portions of the first metal layer 51112, the second metal layer 51113, the third metal layer 51114, the fourth metal layer 51115 and the fifth metal layer 51116 dodge the blank region 51119, and the second substrate 5112 is provided above the blank region 51119, so as to ensure that a relatively small number of metal layers are laid below the DeMUX assembly 540 to reduce an influence of the metal layers on the use of the DeMUX assembly 540.

A specific wiring form of the metal layer of the first substrate 5111 in some embodiments of the present disclosure is also illustrated in detail in FIG. 17A. As shown in FIG. 17A, the blank region 51119 is located on a side of the third metal layer 51114, the second metal layer 51113 is located on the other side of the third metal layer 51114, and a middle portion of the third metal layer 51114 and a second end of the third metal layer 51114 surround the blank region 51119; the second end of the third metal layer 51114 extends to a side edge of the first substrate 5111, and a second end of the second metal layer 51113 extends to a side of the second end of the third metal layer 51114; the fourth metal layer 51115 surrounds a side edge of the blank region 51119 not surrounded by the third metal layer 51114, and a second end of the fourth metal layer 51115 extends to a side of the second end of the third metal layer 51114.

In some embodiments, as shown in FIG. 17A, a second end of the first metal layer 51112 is located between the second end of the second metal layer 51113 and the second end of the third metal layer 51114; a second end of the fifth metal layer 51116 is located between the second end of the fourth metal layer 51115 and the second end of the third metal layer 51114. In this way, it may be convenient to provide devices on the third metal layer 51114 and coordinate arrangement of a connecting line between the metal layer of the first substrate 5111 and the electrical connector 800.

In some embodiments, a first end of the first metal layer 51112 is configured to be electrically connected to the negative electrode of the TEC 5120, a first end of the second metal layer 51113 is configured to be connected to the positive electrode of the SOA 571, a first end of the third metal layer 51114 is configured to be connected to the negative electrode of the temperature sensor 573 and the negative electrode of the SOA 571, a first end of the fourth metal layer 51115 is configured to be connected to the positive electrode of the temperature sensor 573, and a first end of the fifth metal layer 51116 is configured to be connected to the positive electrode of TEC 5120. According to the distribution of the pins on the electrical connector 800, second ends of the first metal layer 51112, the second metal layer 51113, the third metal layer 51114, the fourth metal layer 51115 and the fifth metal layer 51116 are correspondingly connected to corresponding pins on the electrical connector 800.

In some embodiments, an area of the second end of the third metal layer 51114 is relatively large in layout of the metal layers shown in FIG. 17A. In an aspect, in order to ensure grounding performances of the optical amplification assembly 570, the TEC 5120, etc., a plurality of connecting lines need to be provided between the second end of the third metal layer 51114 and the electrical connector 800, and the area of the second end of the third metal layer 51114 is set to be relatively large, so that the second end of the third metal layer 51114 is connected to the electrical connector 800 by means of connecting lines. In another aspect, since negative electrodes of electrical devices such as the light receiving chip 510 and the transimpedance amplifier 590 on the first substrate 5111 also need to be grounded, the area of the second end of the third metal layer 51114 is set to be relatively large, so as to facilitate grounding of negative electrodes of the light receiving chip 510, the transimpedance amplifier 590, etc., and mounting and fixing of the light receiving chip 510, the transimpedance amplifier 590, etc. Thus, in some embodiments of the present disclosure, the second end of the third metal layer 51114 extends to a side edge of the first substrate 5111 in a length direction of the first substrate 5111, and second ends of the first metal layer 51112, the second metal layer 51113, the fourth metal layer 51115, and the fifth metal layer 51116 are slightly far away from the side edge of the first substrate 5111, which facilitates arrangements of the metal layer of the first substrate 5111 and the connecting lines between the electrical devices provided on the first substrate 5111 and the electrical connector 800.

Figure 17B:
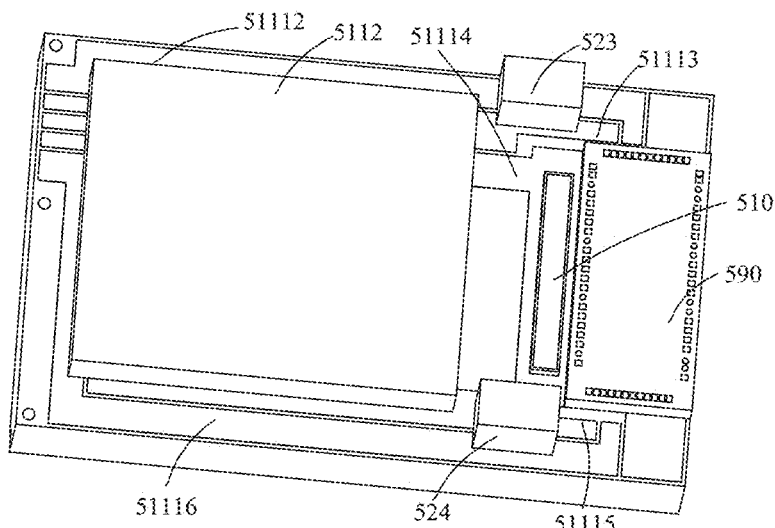
FIG. 17B is a diagram showing a use state of a first substrate in the light receiving assembly shown in FIG. 16A.

FIG. 17B is a diagram showing a use state of a first substrate in the light receiving assembly shown in FIG. 16A. As shown in FIG. 17B, the light receiving chip 510 and the transimpedance amplifier 590 are mounted on the third metal layer 51114. Of course, in some embodiments, in order to ensure normal operation of the light receiving chip 510 and the transimpedance amplifier 590, some devices such as a matching resistor and a matching capacitor may be further required, and therefore, the third metal layer 51114 may be further provided with the devices such as the matching resistor and the matching capacitor.

As shown in FIG. 17B, the second substrate 5112 covers the middle portions of the first metal layer 51112, the second metal layer 51113, the third metal layer 51114, the fourth metal layer 51115, and the fifth metal layer 51116, the first support block 523 is disposed on the first metal layer 51112 and the second metal layer 51113, and the second support block 524 is disposed on the fourth metal layer 51115 and the fifth metal layer 51116. The second substrate 5112 is insulated from the first metal layer 51112, the second metal layer 51113, the third metal layer 51114, the fourth metal layer 51115, and the fifth metal layer 51116, and an insulating material may be covered in the middle portions of the first metal layer 51112, the second metal layer 51113, the third metal layer 51114, the fourth metal layer 51115, and the fifth metal layer 51116, or the second substrate 5112 is a substrate made of an insulating material, such as a ceramic substrate. The first support block 523 is insulated from the first metal layer 51112 and the second metal layer 51113, and the second support block 524 is insulated from the fourth metal layer 51115 and the fifth metal layer 51116; for example, the first support block 523 and the second support block 524 are support blocks made of an insulating material such as plastic and glass. Thus, the first substrate 5111 provided in the embodiments of the present disclosure not only can be used for bearing devices such as the DeMUX assembly 540, but also can realize the electrical connection between the optical amplification assembly 570 and the electrical connector 800, which ensures service performance of the first substrate 5111.

Figure 18:
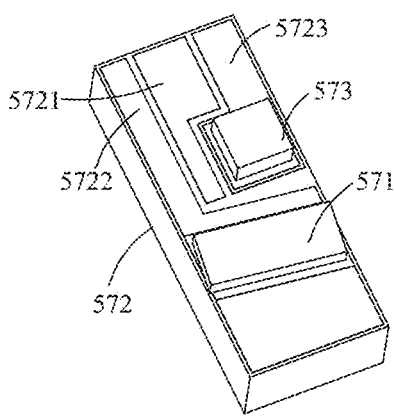
FIG. 18 is a structural diagram of an optical amplification assembly in an optical module, in accordance with some embodiments.

FIG. 18 is a structural diagram of an optical amplification assembly in an optical module, in accordance with some embodiments. As shown in FIG. 18, the optical amplification assembly 570 further includes a fourth substrate 572. In some embodiments, the fourth substrate 572 has a long strip structure to facilitate arrangements of devices such as the second lens 580 and the first lens 560 and to ensure utilization of the third substrate 5113. Of course, the fourth substrate 572 in the embodiments of the present disclosure is not limited to the long strip structure, and may have other shapes.

The fourth substrate 572 includes an SOA positive electrode metal layer 5721, an SOA negative electrode metal layer 5722, and a temperature sensor negative electrode metal layer 5723. The SOA positive electrode metal layer 5721, the SOA negative electrode metal layer 5722, and the temperature sensor negative electrode metal layer 5723 are disposed on a surface of the fourth substrate 572 away from the light receiving bottom plate 5011. Second ends of the SOA positive electrode metal layer 5721, the SOA negative electrode metal layer 5722, and the temperature sensor negative electrode metal layer 5723 are proximate to an end portion of the fourth substrate 572. The SOA 571 is mounted to a first end of the SOA negative electrode metal layer 5722, the negative electrode of the SOA 571 is electrically connected to the SOA negative electrode metal layer 5722, and the positive electrode of the SOA 571 is connected to a first end of the SOA positive electrode metal layer 5721 through a first connecting line. The temperature sensor 573 is mounted to a first end of the temperature sensor negative electrode metal layer 5723, and the negative electrode of the temperature sensor 573 is electrically connected to the temperature sensor negative electrode metal layer 5723.

In some embodiments, the second ends of the SOA positive electrode metal layer 5721, the SOA negative electrode metal layer 5722, and the temperature sensor negative electrode metal layer 5723 and the positive electrode of the temperature sensor 573 may be directly connected to a corresponding metal layer of the first substrate 5111 through a connecting line. Of course, the embodiments of the present disclosure are not limited to connecting the fourth substrate 572 and the first substrate 5111 through a connecting line, and a transition substrate may also be provided between the fourth substrate 572 and the first substrate 5111. The transition substrate includes a circuit pattern formed by a metal layer and disposed on a surface thereof, and the fourth substrate 572 and the first substrate 5111 are electrically connected to the transition substrate correspondingly, so that the fourth substrate 572 and the first substrate 5111 are electrically connected to each other through the transition substrate.

Figure 19:
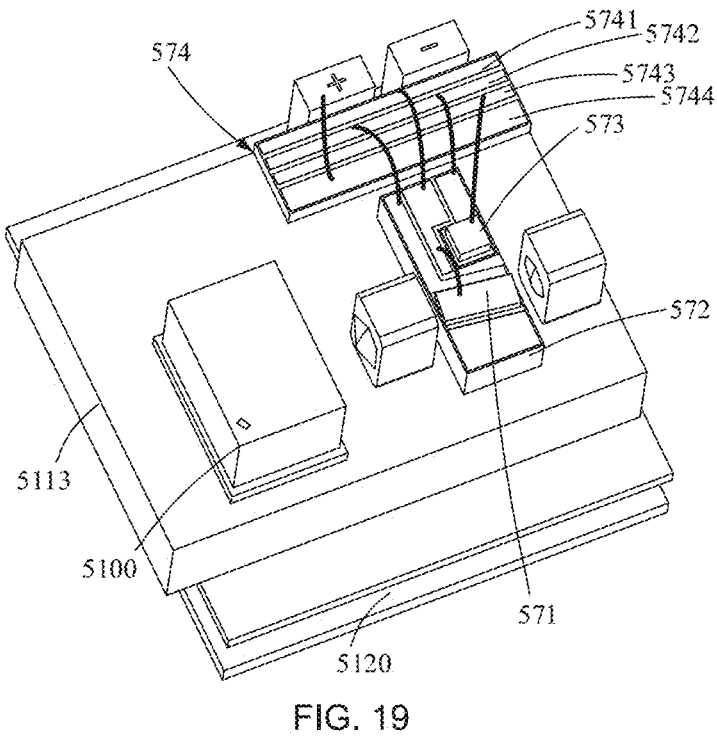
FIG. 19 is a diagram showing a use state of a third substrate in the light receiving assembly shown in FIG. 16A.

FIG. 19 is a diagram showing a use state of a third substrate in the light receiving assembly shown in FIG. 16A. As shown in FIG. 19, in some embodiments, the optical amplification assembly 570 further includes a fifth substrate 574. The fifth substrate 574 is disposed on a surface of the third substrate 5113 away from the TEC 5120 and is located on a side of the fourth substrate 572, and the fifth substrate 574 is used as the transition substrate for electrical connection between the fourth substrate 572 and the first substrate 5111. Of course, the embodiments of the present disclosure are not limited to providing the fifth substrate 574 on the third substrate 5113.

As shown in FIG. 19, the fifth substrate 574 is disposed proximate to the positive electrode and the negative electrode of the TEC 5120 such that relevant connecting lines may be provided in a relatively concentrated manner, thereby facilitating concentrated wire bonding. The fifth substrate 574 includes a plurality of metal strips disposed on a surface thereof, and the plurality of metal strips are used for transition of the metal layers of the fourth substrate 572 to the metal layers of the first substrate 5111.

For example, a plurality of parallel metal strips are provided on a surface of the fifth substrate 574 away from the third substrate 5113. Of course, it is not limited to the parallel metal strips in the embodiments of the present disclosure, and metal strips with any shape may be provided as needed. In some embodiments, as shown in FIG. 19, a length direction of the fourth substrate 572 is perpendicular to a length direction of the fifth substrate 574, and the plurality of parallel metal strips extend in the length direction of the fifth substrate 574 and are arranged in a width direction of the fifth substrate 574, so that the SOA positive electrode metal layer 5721, the SOA negative electrode metal layer 5722, and the temperature sensor negative electrode metal layer 5723 on the fourth substrate 572 are perpendicular to the metal strips on the fifth substrate 574, thereby facilitating the connections of the SOA positive electrode metal layer 5721, the SOA negative electrode metal layer 5722, and the temperature sensor negative electrode metal layer 5723 of the fourth substrate 572 to the fifth substrate 574 through the wire bonding process.

In some embodiments, as shown in FIG. 19, the surface of the fourth substrate 572 is provided with four metal strips parallel to each other, which are successively, from top to bottom, a metal strip for electrically connecting the SOA positive electrode metal layer 5721, a metal strip for electrically connecting the SOA negative electrode metal layer 5722 and the temperature sensor negative electrode metal layer 5723, a metal strip for electrically connecting the positive electrode of the temperature sensor 573, and a metal strip for electrically connecting the positive electrode of the TEC 5120. For ease of description, the four metal strips parallel to each other are sequentially a first metal strip 5741, a second metal strip 5742, a third metal strip 5743 and a fourth metal strip 5744 from top to bottom. The first metal strip 5741 is connected to the SOA positive electrode metal layer 5721 through a second connecting line, the second metal strip 5742 is connected to the SOA negative electrode metal layer 5722 through a third connecting line, the second metal strip 5742 is connected to the temperature sensor negative electrode metal layer 5723 through a connecting line, the third metal strip 5743 is connected to the positive electrode of the temperature sensor 573 through a connecting line, and the fourth metal strip 5744 is connected to the positive electrode of the TEC 5120 through a connecting line.

Figure 20:
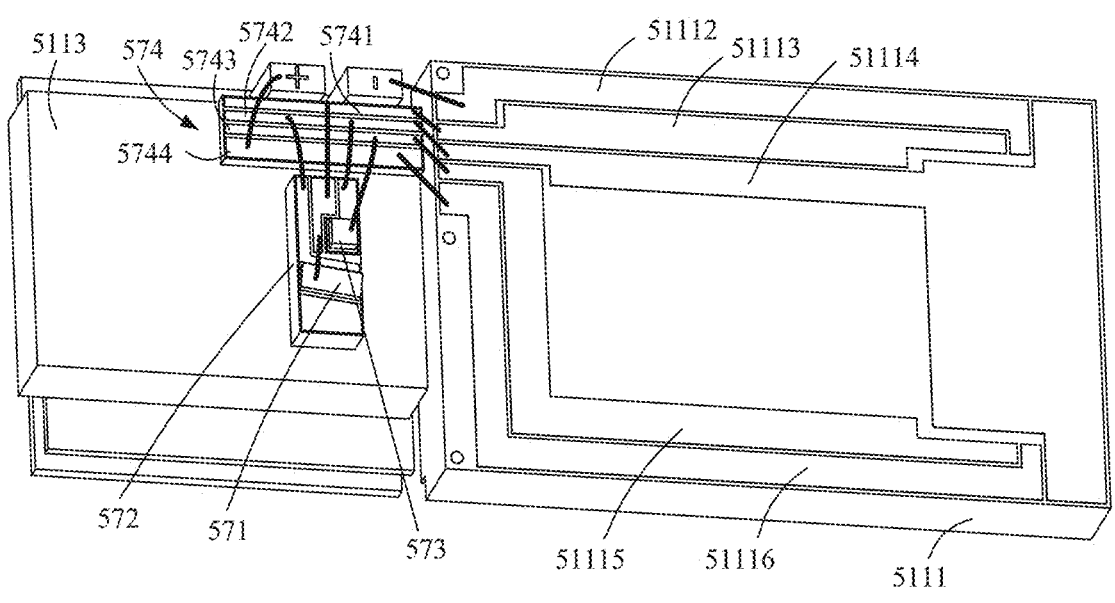
FIG. 20 is a partial structural diagram of the light receiving assembly shown in FIG. 16A.

FIG. 20 is a partial structural diagram of the light receiving assembly shown in FIG. 16A. The positive electrode (e.g., indicated by a symbol "+" in FIG. 20) of the TEC 5120 is located at a left side of the negative electrode (e.g., indicated by a symbol "−" in FIG. 20) of the TEC 5120, and connecting line states of the first substrate 5111, the fourth substrate 572, and the fifth substrate 574 are illustrated in FIG. 20. As shown in FIG. 20, the fifth substrate 574 is disposed at an end portion of the third substrate 5113 proximate to the first substrate 5111, so that an end portion of the fifth substrate 574 is proximate to the first end of the first substrate 5111, and then end portions of the metal strips of the fifth substrate 574 are proximate to the first ends of the metal layers of the first substrate 5111, which facilitates the wire bonding.

As shown in FIG. 20, in some embodiments, the first ends of the metal layers of the first substrate 5111 are proximate to the fifth substrate 574, the first metal strip 5741 is connected to the second metal layer 51113 through a fourth connecting line, the second metal strip 5742 is connected to the third metal layer 51114 through a fifth connecting line, the third metal strip 5743 is connected to the fourth metal layer 51115 through a connecting line, and the fourth metal strip 5744 is connected to the fifth metal layer 51116 through a connecting line. In the embodiments of the present disclosure, the fourth substrate 572 and the first substrate 5111 are respectively connected to the fifth substrate 574 through a connecting line, so that the connecting lines between the substrates can be sequentially arranged, which effectively avoids intersection of the connecting lines, and ensures the service performance of the connecting lines.

Figure 21A:
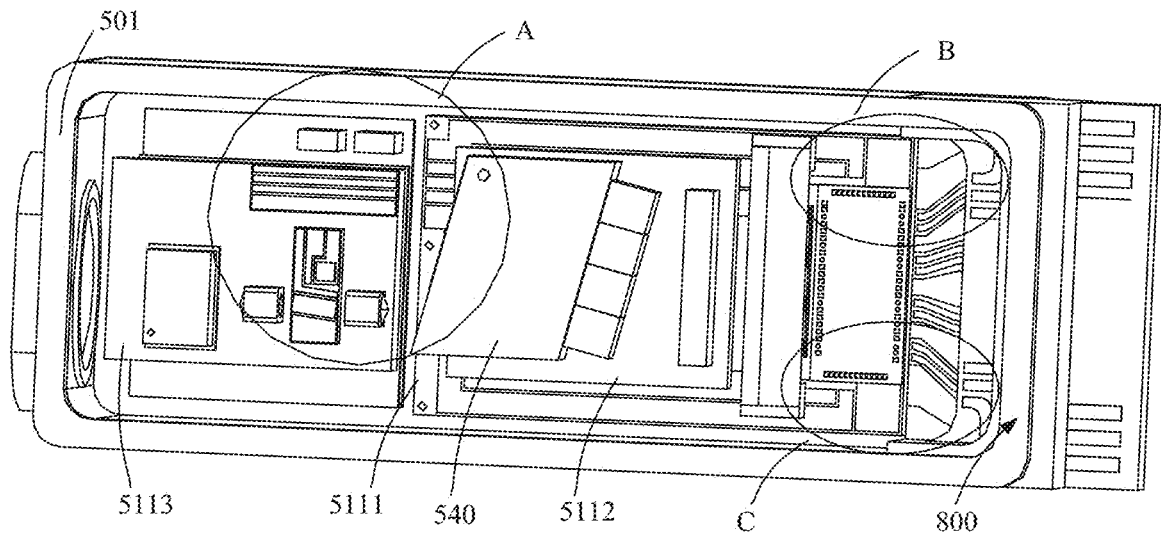
FIG. 21A is a diagram showing an internal structure of a light receiving lower shell in the light receiving assembly shown in FIG. 16A.
Figure 21B:
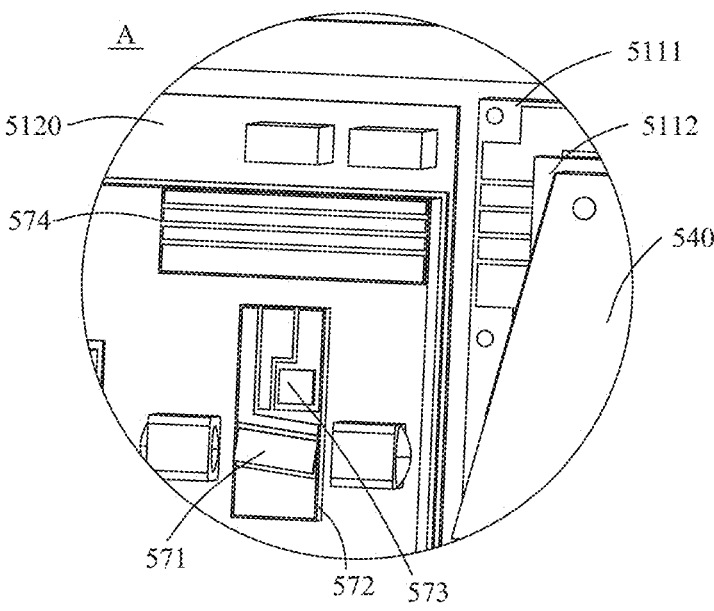
FIG. 21B is an enlarged view of the region A in FIG. 21A.
Figure 21C:
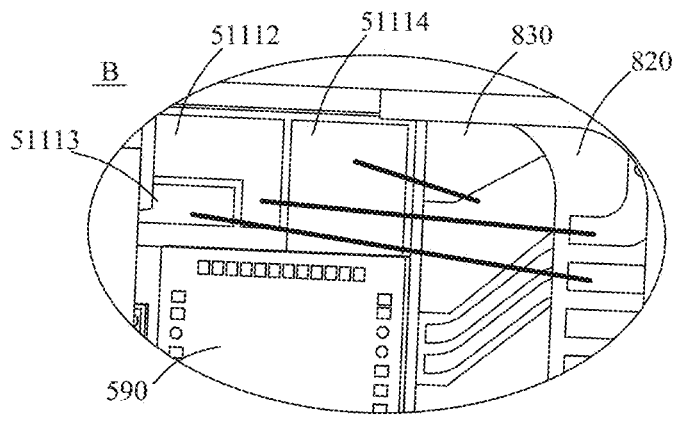
FIG. 21C is an enlarged view of the region B in FIG. 21A.
Figure 21D:
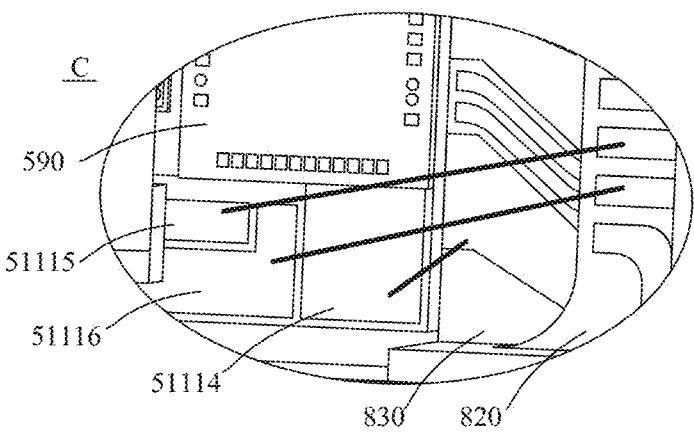
FIG. 21D is an enlarged view of the region C in FIG. 21A.

FIG. 21A is a diagram showing an internal structure of a light receiving lower case in the light receiving assembly shown in FIG. 16A, and FIG. 21A shows a structure of the light receiving assembly 500 in the light receiving lower shell 501 and a layout for providing electrical connection for the optical amplification assembly 570 and the TEC 5120 in the embodiments of the present disclosure; FIG. 21B is an enlarged view of the region A in FIG. 21A, FIG. 21C is an enlarged view of the region B in FIG. 21A, and FIG. 21D is an enlarged view of the region C in FIG. 21A. FIGS. 21B to 21D show wire bonding structures of relevant parts. In the layout designed in FIGS. 21A to 21D, the metal layers of the first substrate 5111 are connected to the metal strips of the fifth substrate 574, and the metal strips of the fifth substrate 574 are connected to the metal layer of the fourth substrate 572, so that the electrical connector 800 supplies power to the optical amplification assembly 570, the TEC 5120, etc., and then power supply stability of the optical amplification assembly 570, the TEC 5120, etc. is ensured. Of course, a specific layout form in the embodiments of the present disclosure is not limited to the layout form in FIG. 21A, and appropriate modifications and adjustments may be made.

In some embodiments, gain of the SOA 571 may be adjusted according to an intensity of the optical signal actually transmitted to the SOA 571, so that power of the optical signal transmitted to the light receiving chip 510 is maintained in a relatively stable state. Therefore, the gain of the SOA 571 may be adjusted according to the intensity of the optical signal transmitted to the light receiving assembly 500.

In some embodiments, to realize the electrical connection between the optical amplification assembly 570, the TEC 5120, etc. and the electrical connector 800, the present disclosure is not limited to providing a metal layer on the surface of the first substrate 5111, and a metal layer or another substrate having a metal layer may be provided on the surface of the second substrate 5112.

Figure 22:
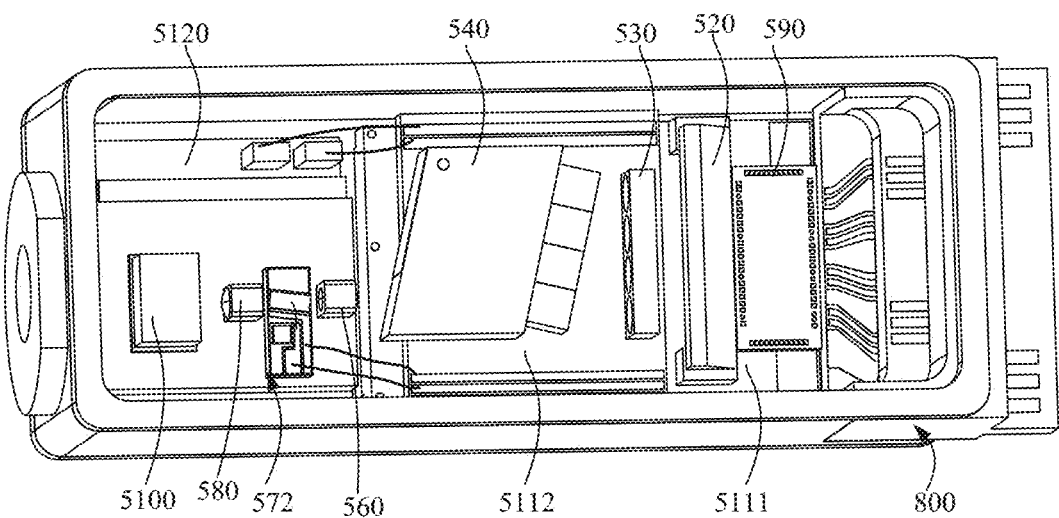
FIG. 22 is a structural diagram of yet another light receiving assembly in an optical module with a light receiving upper cover removed, in accordance with some embodiments.

FIG. 22 is a structural diagram of yet another light receiving assembly in an optical module with a light receiving upper cover removed, in accordance with some embodiments. As shown in FIG. 22, the second substrate 5112 provided in the embodiments of the present disclosure includes a metal layer disposed on a surface thereof. By providing the metal layer on the surface of the second substrate 5112, the devices such as the optical amplification assembly 570 and the TEC 5120 are electrically connected to the electrical connector 800.

In some embodiments, the metal layer of the second substrate 5112 is disposed at a position of the second substrate 5112 proximate to the light receiving side plate 5012 of the light receiving lower shell 501. It will be noted that a shape of the metal layer of the second substrate 5112 is not limited in the present disclosure. The metal layer of the second substrate 5112 may have a long strip structure, or may have other shapes.

Figure 23:
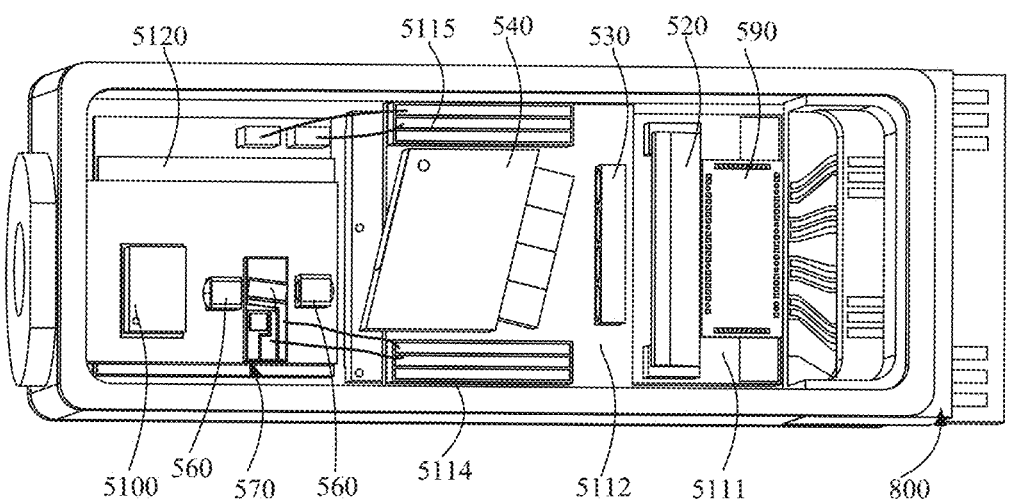
FIG. 23 is a structural diagram of yet another light receiving assembly in an optical module with a light receiving upper cover removed, in accordance with some embodiments.

FIG. 23 is a structural diagram of yet another light receiving assembly in an optical module with a light receiving upper cover removed, in accordance with some embodiments. As shown in FIG. 23, the substrate assembly 5110 further includes a sixth substrate 5114 and a seventh substrate 5115, and the sixth substrate 5114 and the seventh substrate 5115 each include a metal layer disposed on a surface thereof, so that the devices such as the optical amplification assembly 570 and the TEC 5120 are electrically connected to the electrical connector 800 through the sixth substrate 5114 and the seventh substrate 5115.

In some embodiments, as shown in FIG. 23, the sixth substrate 5114 and the seventh substrate 5115 are disposed on the second substrate 5112, that is, the second substrate 5112 is used to fixedly support the sixth substrate 5114 and the seventh substrate 5115, and the sixth substrate 5114 and the seventh substrate 5115 are disposed at a position of the second substrate 5112 proximate to the light receiving side plate 5012 of the light receiving lower shell 501. As shown in FIG. 23, the sixth substrate 5114 is disposed at an end of the second substrate 5112 for electrically connecting the optical amplification assembly 570 and the electrical connector 800; and the seventh substrate 5115 is disposed at the other end of the second substrate 5112 for electrically connecting the TEC 5120 and the electrical connector 800. It will be noted that shapes of the metal layers on the sixth substrate 5114 and the seventh substrate 5115 are not limited in the present disclosure. The metal layers on the sixth substrate 5114 and the seventh substrate 5115 may have a long strip structure.

In some embodiments, the sixth substrate 5114 and the seventh substrate 5115 may also be disposed on the first substrate 5111 or on the light receiving bottom plate 5011 of the light receiving lower shell 501.

Figure 24:
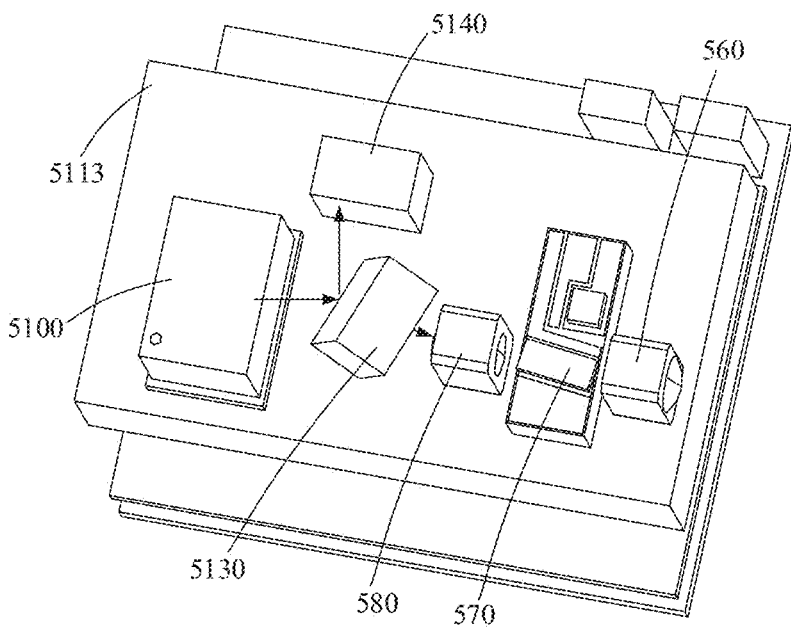
FIG. 24 is a structural diagram of a third substrate in a use state in yet another light receiving assembly, in accordance with some embodiments.

FIG. 24 is a structural diagram of a third substrate in a use state in yet another light receiving assembly, in accordance with some embodiments, and FIG. 24 shows a partial structure of yet another light receiving assembly 500. As shown in FIG. 24, the light receiving assembly 500 further includes an optical splitter 5130 and a backlight detector 5140. The optical splitter 5130 is configured to split light of certain power from the optical signal transmitted from the outside of the optical module 200 to the inside of the light receiving cavity, and transmit the split light to the backlight detector 5140. The backlight detector 5140 is configured to receive the light split by the optical splitter 5130 and determine an intensity of the optical signal transmitted from the outside of the optical module 200 to the inside of the light receiving cavity according to an optical power of the received optical signal. For example, the optical splitter 5130 transmits an optical signal of 2% to 5% optical power, which is transmitted from the outside of the optical module 200 to the inside of the light receiving cavity, to the backlight detector 5140. However, the present disclosure is not limited thereto.

As shown in FIG. 24, in some embodiments, the optical splitter 5130 and the backlight detector 5140 are disposed on the third substrate 5113; the optical splitter 5130 is disposed between the isolator 5100 and the second lens 580, and an optical signal transmitted through the isolator 580 is transmitted to the optical splitter 5130; and the optical signal of a portion of optical power transmitted to the optical splitter 5130 is reflected and transmitted to the backlight detector 5140, and the optical signal of another portion of optical power is transmitted through the optical splitter 5130 and then transmitted to the second lens 580. A transmission direction of the optical signal transmitted from the outside of the optical module 200 to the light receiving cavity is shown by arrows in FIG. 24.

Figure 25:
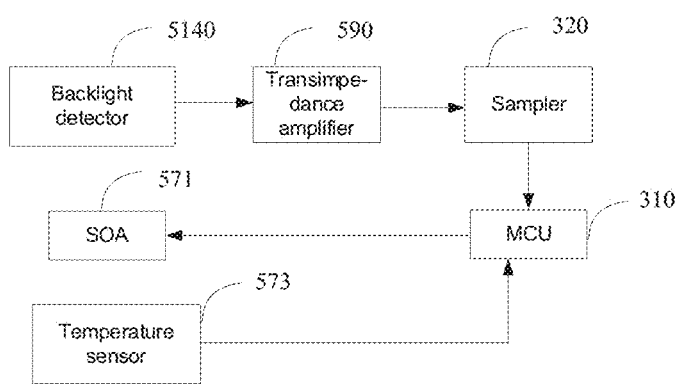
FIG. 25 is a schematic diagram of a gain control circuit of a semiconductor optical amplifier (SOA) in a light receiving assembly, in accordance with some embodiments.

FIG. 25 is a schematic diagram of a gain control circuit of a SOA in a light receiving assembly, in accordance with some embodiments. As shown in FIG. 25, in some embodiments, the gain control circuit of the SOA 571 includes an MCU 310 and a sampler 320. The MCU 310 determines gain of the SOA 571 according to a signal collected by the sampler 320, so as to control an operating current applied to the SOA As shown in FIG. 25, in some embodiments, the backlight detector 5140 receives the optical signal reflected by the optical splitter 5130 and converts the optical signal into an electrical signal. An output end of the backlight detector 5140 is electrically connected to the transimpedance amplifier 590, so that the electrical signal converted by the backlight detector 5140 is transmitted to the transimpedance amplifier 590 and then amplified by the transimpedance amplifier 590.

The MCU 310 and the sampler 320 are both disposed on the circuit board 300. The sampler 320 is connected between the transimpedance amplifier 590 and the MCU 310 and is configured to collect an analog signal of the transimpedance amplifier 590 and obtain a corresponding digital signal according to the analog signal. The MCU 310 is configured to determine an optical power of the optical signal received by the backlight detector 5140 according to the digital signal obtained by the sampler 320, so that an actual optical power of the optical signal from the outside of the optical module 200 is determined, and then the gain of the SOA 571 is determined with reference to an expected value of an optical power of the optical module 200, and an operating current of the SOA 571 is determined according to the gain of the SOA 571. In some embodiments, a lookup table of the operating current of the SOA 571 corresponding to the optical power of the optical signal received by the backlight detector 5140 may be stored in a register of the MCU 310. In a case where the optical power of the optical signal received by the backlight detector 5140 is obtained, the operating current of the SOA 571 is obtained through the lookup table.

As shown in FIG. 25, the temperature sensor 573 is connected to the MCU 310, and is configured to transmit a collected temperature signal to the MCU 310, and the MCU 310 determines, according to the received temperature signal, a current that needs to be applied to the TEC 5120 and a direction of the current, thereby enabling the TEC 5120 to effectively control a temperature of the SOA 571, ensuring that the SOA 571 operates within a set temperature range, and making the SOA 571 have a good operating performance.

In some embodiments, the register of the MCU 310 has stored therein a lookup table of the temperature signal, the gain of the SOA 571 and a driving current of the TEC 5120. A current to be applied to the TEC 5120 and a direction of the current are determined according to the collected temperature signal and the set gain of the SOA 571. The TEC 5120 is driven according to the current and the direction of the current that are determined, so that the TEC 5120 adjusts and controls the operating temperature of the SOA 571.

In the light receiving assembly 500 in the embodiments of the present disclosure, the optical signal from the outside of the optical module is finally received by the light receiving chip 510 through light beam conversion by the first lens 580, amplification by the SOA 571 in the optical amplification assembly 570, light beam conversion by the second lens 560, wavelength division by the DeMUX assembly 540, light beam conversion by the lens group 530, and reflection by the reflecting prism 520. The connections of the structures are reasonably realized, respective functions are played, and a reasonable optical design and optical path design are obtained. In addition, the SOA 571 in the optical amplification assembly 570 is reasonably integrated in the structure of the light receiving assembly 500, and is well connected to other devices, so as to amplify the power of the optical signal received by the light receiving assembly 500, and finally the optical module with a high sensitivity and long-distance transmission is obtained.

It will be appreciated by those skilled in the art that the scope of the present disclosure is not limited to the specific embodiments described above, and that modifications and substitutions of certain elements of the embodiments may be made without departing from the spirit of the present disclosure. The scope of the present disclosure is limited by the claims appended hereto.

What is claimed is:

1. An optical module, comprising:
a circuit board; and
a light receiving assembly electrically connected to the circuit board and configured to receive optical signals from outside of the optical module, wherein
the light receiving assembly includes:
a light receiving cavity;
an optical amplification assembly disposed in the light receiving cavity and configured to amplify the optical signals, wherein the optical amplification assembly includes a fourth substrate and a semiconductor optical amplifier (SOA), the fourth substrate is electrically connected to the circuit board, and the SOA is disposed on the fourth substrate and is electrically connected to the fourth substrate; and
a light receiving chip disposed in the light receiving cavity and configured to receive amplified optical signals.

2. The optical module according to claim 1, wherein the optical amplification assembly further includes a temperature sensor; and
the temperature sensor is disposed on the fourth substrate and is electrically connected to the fourth substrate.

3. The optical module according to claim 2, wherein the light receiving assembly further includes:
a thermo electric cooler (TEC) disposed in the light receiving cavity; and
a third substrate disposed on the TEC, the fourth substrate being disposed on the third substrate.

4. The optical module according to claim 1, wherein the light receiving assembly further includes:

a first substrate disposed in the light receiving cavity, the light receiving chip being disposed on the first substrate;

the first substrate includes a metal layer, the metal layer is disposed on a surface of the first substrate and extends from a first end of the first substrate to a second end of the first substrate, and the fourth substrate is electrically connected to the circuit board through the metal layer of the first substrate.

5. The optical module according to claim 4, wherein the light receiving assembly further includes a fifth substrate; and the fifth substrate is disposed in the light receiving cavity, and is electrically connected to the fourth substrate and the metal layer of the first substrate.

6. The optical module according to claim 5, wherein the fourth substrate includes:

a SOA positive electrode metal layer disposed on a surface of the fourth substrate proximate to the SOA, a positive electrode of the SOA being electrically connected to the SOA positive electrode metal layer through a first connecting line; and a SOA negative electrode metal layer disposed on the surface of the fourth substrate proximate to the SOA, a negative electrode of the SOA being mounted on the SOA negative electrode metal layer.

7. The optical module according to claim 6, wherein the fifth substrate includes:

a first metal strip disposed on a surface of the fifth substrate and electrically connected to the SOA positive electrode metal layer through a second connecting line; and a second metal strip disposed on the surface of the fifth substrate and electrically connected to the SOA negative electrode metal layer through a third connecting line.

8. The optical module according to claim 7, wherein the metal layer of the first substrate includes:

a second metal layer disposed on a surface of the first substrate proximate to the light receiving chip and electrically connected to the first metal strip through a fourth connecting line; and a third metal layer disposed on the surface of the first substrate proximate to the light receiving chip and electrically connected to the second metal strip through a fifth connecting line.

9. The optical module according to claim 5, wherein the light receiving cavity includes a light receiving lower shell including a first opening and a second opening arranged opposite to each other; and the optical module further comprises:

a fiber optic adapter assembly inserted into the light receiving cavity through the first opening; and an electrical connector inserted into the light receiving cavity through the second opening and electrically connected to the metal layer of the first substrate and the circuit board.

10. The optical module according to claim 9, wherein the electrical connector includes:

an electrical connector body;

a first step surface disposed at a first end of the electrical connector body;

a second step surface disposed at the first end of the electrical connector body and in a staggered step-like shape with the first step surface;

a first connecting surface disposed at a second end of the electrical connector body; and a second connecting surface disposed at the second end of the electrical connector body and arranged opposite to the first connecting surface.

11. The optical module according to claim 10, wherein the electrical connector further includes:

a direct current pin disposed on the first step surface and electrically connected to a positive electrode of the SOA through the first substrate;

a grounding pin disposed on the second step surface and electrically connected to a negative electrode of the SOA through the first substrate;

a pin disposed on the first connecting surface and connected to the direct current pin and the circuit board; and another pin disposed on the second connecting surface and connected to the grounding pin and the circuit board.

12. The optical module according to claim 1, wherein the light receiving assembly further includes:

a first substrate disposed in the light receiving cavity, the light receiving chip being disposed on the first substrate;

a second substrate disposed on the first substrate;

a demultiplexing (DeMUX) assembly disposed on the second substrate and located at a light exit side of the optical amplification assembly; and a lens group disposed on the second substrate and located at a light exit side of the DeMUX assembly.

13. The optical module according to claim 12, wherein the second substrate includes a metal layer;

the metal layer is disposed on a surface of the second substrate and proximate to an edge of the second substrate, and the fourth substrate is electrically connected to the circuit board through the metal layer of the second substrate.

14. The optical module according to claim 12, wherein the light receiving assembly further includes a sixth substrate;

the sixth substrate is disposed on the second substrate and proximate to an edge of the second substrate, and the fourth substrate is electrically connected to the circuit board through the sixth substrate.

15. The optical module according to claim 14, wherein the sixth substrate includes a metal layer; and the metal layer is disposed on a surface of the sixth substrate and extends from an end of the sixth substrate to another end of the sixth substrate, and the fourth substrate is electrically connected to the circuit board through the metal layer of the sixth substrate.

16. The optical module according to claim 12, wherein the light receiving assembly further includes:

a first support block disposed on the first substrate and located at a side of the light receiving chip;

a second support block disposed on the first substrate and located at another side of the light receiving chip; and a reflecting prism disposed on the first support block and the second support block such that the reflecting prism covers the light receiving chip.

17. The optical module according to claim 16, wherein the light receiving assembly further includes:

an isolator disposed at a light incident side of the optical amplification assembly;

a second lens disposed between the isolator and the optical amplification assembly; and a first lens disposed between the optical amplification assembly and the DeMUX assembly; and an optical signal from outside of the optical module is incident on the optical amplification assembly through the isolator and the second lens, is amplified by the optical amplification assembly, is incident on the reflecting prism through the first lens, the DeMUX assembly and the lens group, and is reflected to the light receiving chip by the reflecting prism.

18. The optical module according to claim 17, wherein the light receiving assembly further includes:

an optical splitter disposed between the isolator and the second lens and configured to reflect a part of optical signals from the outside of the optical module and transmit another part of the optical signals; and a backlight detector disposed on a reflection optical path of the optical splitter and configured to receive the optical signals reflected by the optical splitter and determine an optical power of the optical signals from the outside of the optical module according to an optical power of the received optical signals.

19. The optical module according to claim 18, further comprising:

a sampler disposed on the circuit board, connected to the backlight detector, and configured to receive analog signals output by the backlight detector and convert the analog signals into digital signals; and a microcontroller unit (MCU) disposed on the circuit board, connected to the sampler, and configured to control an operating current of the SOA according to the digital signals.

20. The optical module according to claim 12, wherein the first substrate includes a first unfilled corner and a second unfilled corner; and the first unfilled corner and the second unfilled corner are disposed on a surface of the first substrate away from the light receiving chip, and are arranged in a width direction of the first substrate.

* * * * *